(12) United States Patent
Leirer et al.

(10) Patent No.: US 10,535,806 B2
(45) Date of Patent: Jan. 14, 2020

(54) COMPONENT AND METHOD OF PRODUCING COMPONENTS

(71) Applicant: OSRAM Opto Semiconductors GmbH, Regensburg (DE)

(72) Inventors: Christian Leirer, Friedberg (DE); Korbinian Perzlmaier, Regensburg (DE); Anna Kasprzak-Zablocka, Donaustauf (DE); Berthold Hahn, Hemau (DE); Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 25 days.

(21) Appl. No.: 15/742,106

(22) PCT Filed: Jul. 11, 2016

(86) PCT No.: PCT/EP2016/066428
§ 371 (c)(1),
(2) Date: Jan. 5, 2018

(87) PCT Pub. No.: WO2017/009285
PCT Pub. Date: Jan. 19, 2017

(65) Prior Publication Data
US 2018/0212121 A1    Jul. 26, 2018

(30) Foreign Application Priority Data

Jul. 15, 2015 (DE) .................. 10 2015 111 492

(51) Int. Cl.
*H01L 33/62* (2010.01)
*H01L 33/48* (2010.01)
(Continued)

(52) U.S. Cl.
CPC .......... *H01L 33/62* (2013.01); *H01L 33/0079* (2013.01); *H01L 33/0095* (2013.01);
(Continued)

(58) Field of Classification Search
CPC ....... H01L 33/52; H01L 33/54; H01L 33/486; H01L 33/62; H01L 33/387; H01L 33/382;
(Continued)

(56) References Cited

U.S. PATENT DOCUMENTS 4,843,280 A   6/1989 Lumbard et al.
6,281,435 B1  8/2001 Maekawa
(Continued)

FOREIGN PATENT DOCUMENTS

DE   100 17 741 A1   10/2001
DE   101 22 666 A1   11/2001
(Continued)

*Primary Examiner* — Zandra V Smith
*Assistant Examiner* — Abbigale A Boyle
(74) *Attorney, Agent, or Firm* — DLA Piper LLP (US)

(57) ABSTRACT

A component includes a carrier having a front side facing towards a semiconductor body and a rear side facing away from the semiconductor body, each of which is formed at least in places by a surface of a shaped body, a metal layer contains a first sub-region and a second sub-region, wherein the first sub-region and the second sub-region adjoin the shaped body in a lateral direction, are electrically connectable in a vertical direction on the front side of the carrier, are assigned to different electrical polarities of the component and are thus configured to electrically contact the semiconductor body, and the carrier has a side face running perpendicularly or obliquely to the rear side of the carrier and is configured as a mounting surface of the component, wherein at least one of the sub-regions is electrically connectable via the side face and exhibits singulation traces.

20 Claims, 10 Drawing Sheets

(51) Int. Cl.
*H01L 33/52* (2010.01)
*H01L 33/00* (2010.01)
*H01L 33/22* (2010.01)
*H01L 33/38* (2010.01)
*H01L 33/44* (2010.01)
*H01L 33/50* (2010.01)
*H01L 33/64* (2010.01)

(52) U.S. Cl.
CPC ............ *H01L 33/22* (2013.01); *H01L 33/382* (2013.01); *H01L 33/44* (2013.01); *H01L 33/486* (2013.01); *H01L 33/505* (2013.01); *H01L 33/52* (2013.01); *H01L 33/647* (2013.01); *H01L 2933/0016* (2013.01); *H01L 2933/0025* (2013.01); *H01L 2933/0033* (2013.01); *H01L 2933/0041* (2013.01)

(58) Field of Classification Search
CPC ....... H01L 33/647; H01L 24/94; H01L 24/95; H01L 24/96; H01L 24/97; H01L 23/49805; H01L 23/49861
See application file for complete search history.

(56) References Cited

U.S. PATENT DOCUMENTS

| | | | |
|---|---|---|---|
| 8,614,455 B2* | 12/2013 | Obata | H01L 33/62 257/88 |
| 8,754,429 B2* | 6/2014 | Koizumi | H01L 33/44 257/98 |
| 9,202,992 B2* | 12/2015 | Tomizawa | H01L 33/44 |
| 2001/0030359 A1 | 10/2001 | Hogerl et al. | |
| 2001/0042858 A1 | 11/2001 | Ishinaga | |
| 2002/0060342 A1 | 5/2002 | Kobayakawa | |
| 2003/0006421 A1 | 1/2003 | Yasukawa et al. | |
| 2008/0164484 A1 | 7/2008 | Lee | |
| 2008/0258168 A1 | 10/2008 | Loh et al. | |
| 2009/0206356 A1 | 8/2009 | Tsuchiya | |
| 2013/0099276 A1* | 4/2013 | Fukushima | H01L 33/46 257/99 |
| 2013/0187188 A1 | 7/2013 | Sasaoka et al. | |
| 2014/0008770 A1 | 1/2014 | Günther et al. | |
| 2014/0190732 A1 | 7/2014 | Bergenek et al. | |
| 2014/0246648 A1* | 9/2014 | Im | H01L 33/382 257/13 |
| 2015/0162502 A1 | 6/2015 | Fujita et al. | |
| 2015/0318444 A1* | 11/2015 | Huang | H01L 25/0753 257/99 |
| 2016/0225964 A1 | 8/2016 | Schwarz et al. | |
| 2017/0077070 A1 | 3/2017 | Schwarz et al. | |

FOREIGN PATENT DOCUMENTS

| | | |
|---|---|---|
| DE | 602 09 964 T2 | 11/2006 |
| DE | 10 2011 011 378 A1 | 8/2012 |
| DE | 10 2011 079 708 A1 | 1/2013 |
| DE | 10 2013 110 733 A1 | 4/2015 |
| DE | 10 2014 106 791 A1 | 11/2015 |

* cited by examiner

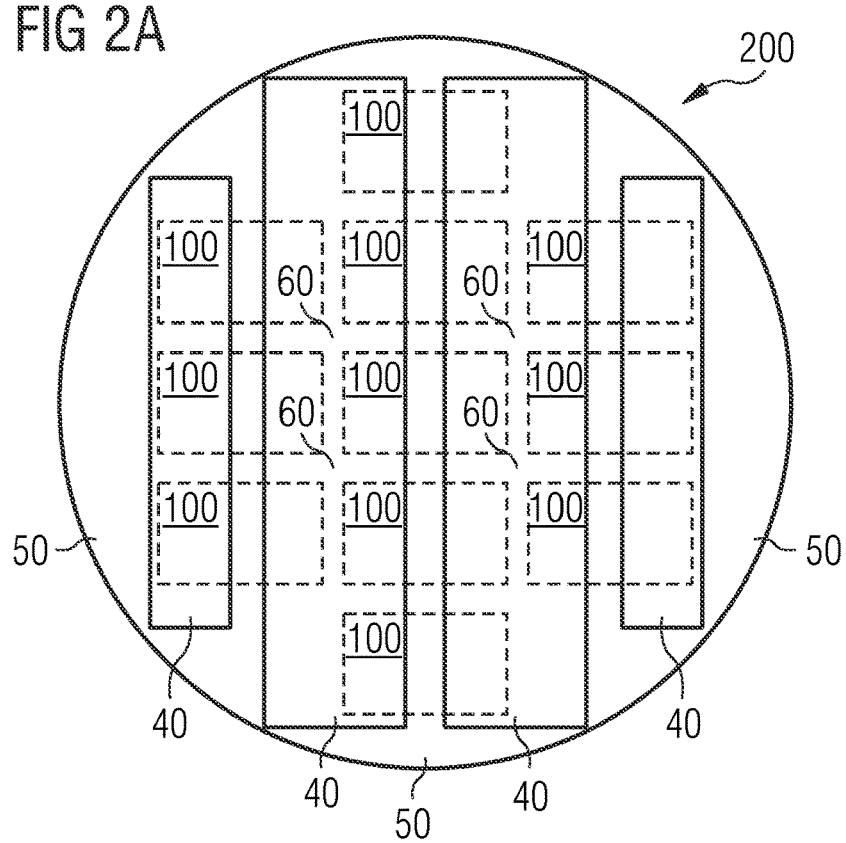
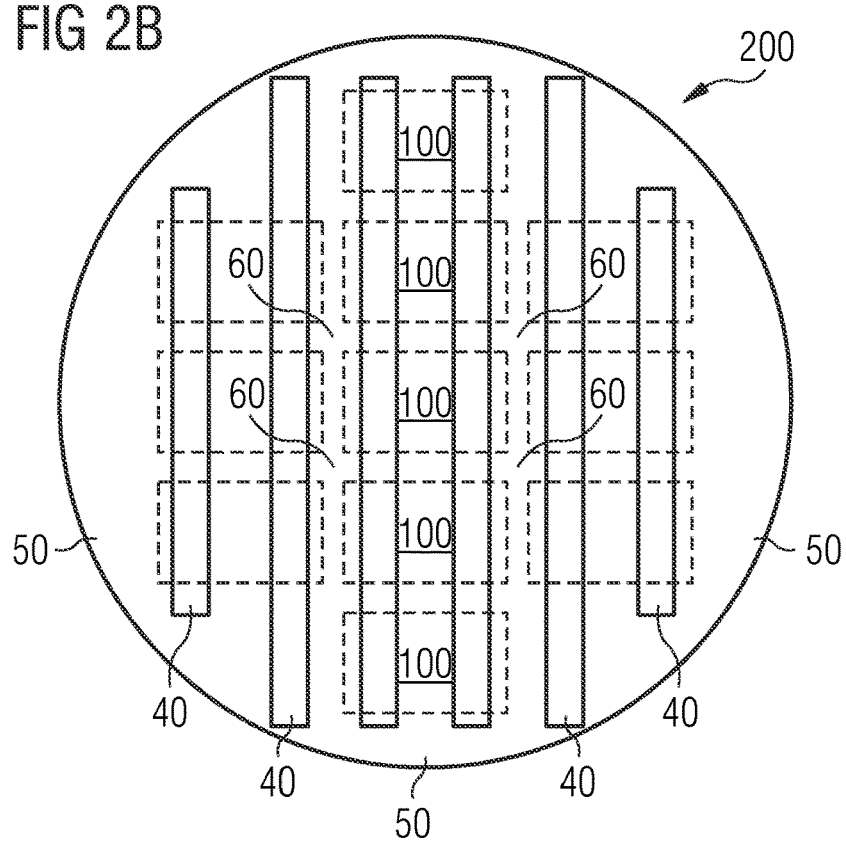

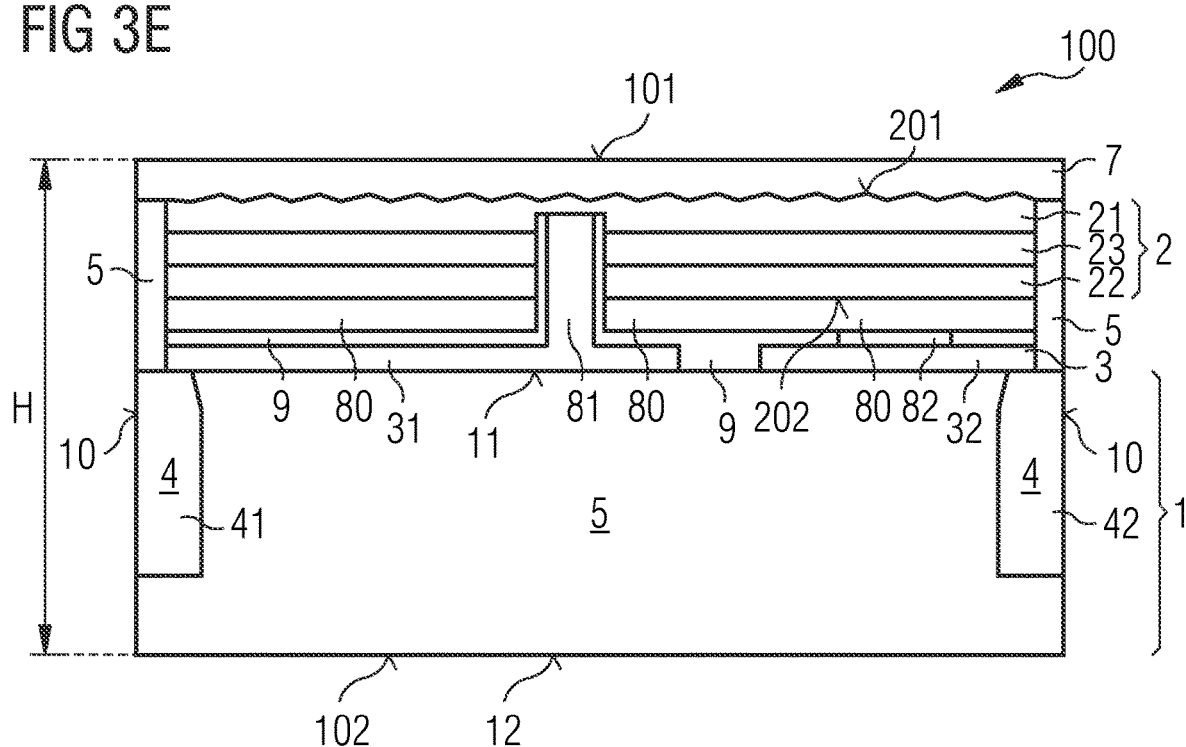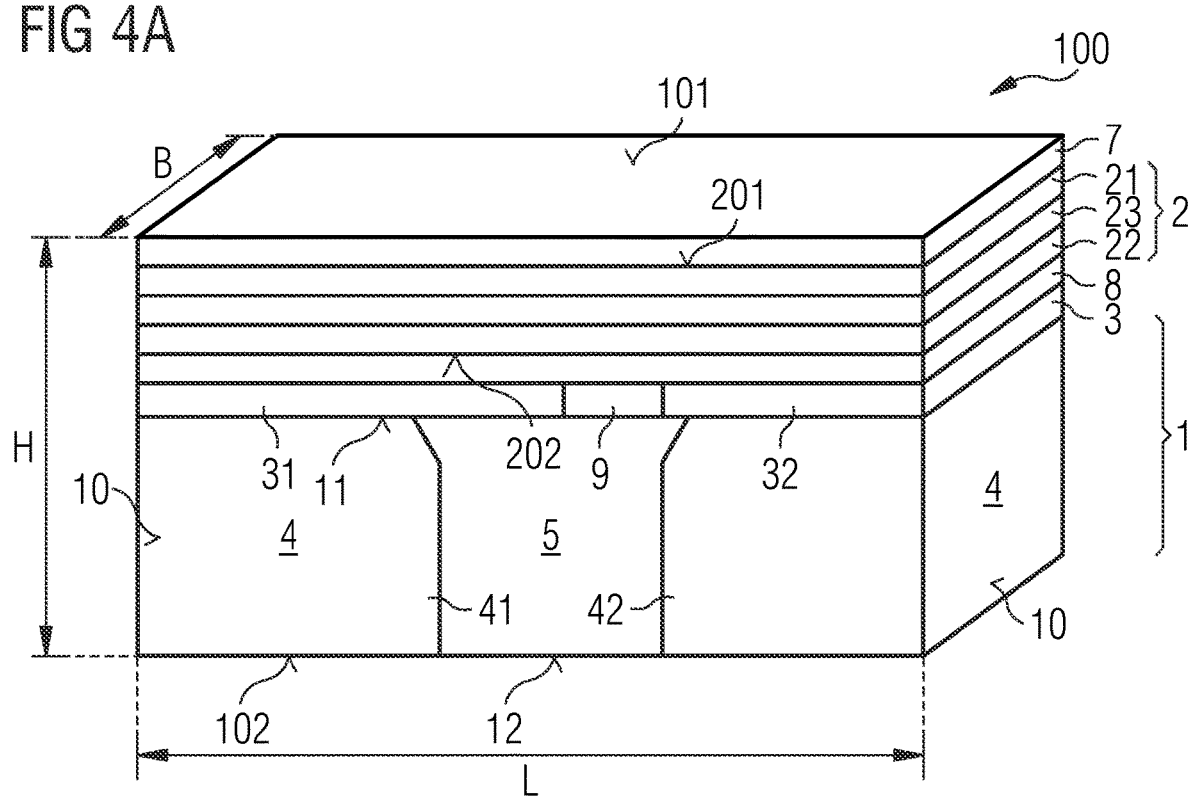

COMPONENT AND METHOD OF PRODUCING COMPONENTS

TECHNICAL FIELD

This disclosure relates to a component and a method of producing a plurality of components.

BACKGROUND

For backlighting applications, components with particularly low installation heights are required. Conventional components with low installation heights often suffer from a lack of mechanical stability or are difficult to implement since the external dimensions of the components with common housing technologies are frequently much larger than light-emitting surfaces of the components.

There is thus a need to provide a component having a low installation height and high mechanical stability, and a simplified and at the same time inexpensive method of producing a plurality of components.

SUMMARY

We provide a component including a carrier and a semiconductor body arranged on the carrier, wherein the carrier includes a metal layer and a shaped body composed of a plastic, wherein the carrier has a front side facing towards the semiconductor body and a rear side facing away from the semiconductor body, each of which is formed at least in places by a surface of the shaped body, the metal layer contains a first sub-region and a second sub-region, wherein the first sub-region and the second sub-region adjoin the shaped body in a lateral direction, are electrically connectable in a vertical direction on the front side of the carrier, are assigned to different electrical polarities of the component and are thus configured to electrically contact the semiconductor body, and the carrier has a side face running perpendicularly or obliquely to the rear side of the carrier and is configured as a mounting surface of the component, wherein at least one of the sub-regions is electrically connectable via the side face and exhibits singulation traces.

We also provide a method of producing a plurality of components including:
A) preparing a composite having a semiconductor layer stack and a contiguous shaped body composite composed of a plastic arranged on the semiconductor layer stack, wherein the semiconductor layer stack is severable into a plurality of semiconductor bodies,
B) forming a plurality of contact layers on the semiconductor layer stack to electrically contact the semiconductor bodies, wherein the contact layers each overlap with at least two adjacently arranged semiconductor bodies in a top view, and
C) singulating the composite into a plurality of components such that
the contact layers are cut during singulation in areas between the adjacently arranged semiconductor bodies,
the singulated components each include a semiconductor body and a carrier, the semiconductor bodies originating from the semiconductor layer stack, and
the carrier of the respective component includes a shaped body and a metal layer, wherein the shaped body originates from the shaped body composite, the metal layer includes two sub-regions composed of different contact layers to electrically contact the associated semiconductor body and at least one of the sub-regions is formed to be electrically connectable on a side face of the carrier.

We further provide a component including a carrier and a semiconductor body arranged on the carrier, wherein the carrier includes a metal layer and a shaped body composed of a plastic, wherein the carrier has a front side facing towards the semiconductor body and a rear side facing away from the semiconductor body, each of which is formed at least in places by a surface of the shaped body, the metal layer contains a first sub-region and a second sub-region, wherein the first sub-region and the second sub-region adjoin the shaped body in a lateral direction, are electrically connectable in a vertical direction on the front side of the carrier, are assigned to different electrical polarities of the component and are thus configured to electrically contact the semiconductor body, the carrier has a side face running perpendicularly or obliquely to the rear side of the carrier and is configured as a mounting surface of the component, wherein at least one of the sub-regions is electrically connectable via the side face, and the component is formed as a sidelooker, wherein a main emission direction of the component runs parallel to the side face of the carrier formed as a mounting surface of the component.

BRIEF DESCRIPTION OF THE DRAWINGS

FIGS. 2A to 2F show various examples of the forming of contact layers before singulation of the composite into a plurality of components in sectional views.

LIST OF REFERENCE NUMBERS

Figure 1A:
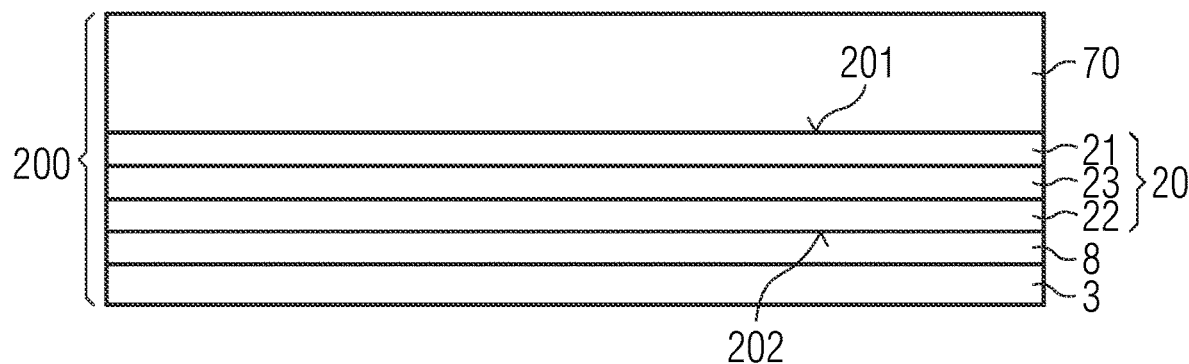
FIGS. 1A to 1H show various method steps of an example of a method of producing a plurality of components in sectional views.

100 Component
101 Radiation passage surface
102 Rear side of the component
1 Carrier
10 Side face of the carrier/component
11 Front side of the carrier
12 Rear side of the carrier
2 Semiconductor body
20 Semiconductor layer stack
21 First semiconductor layer
22 Second semiconductor layer
23 Active layer
200 Composite
201 First main surface of the semiconductor body
202 Second main surface of the semiconductor body
3 Stabilizing layer
30 Intermediate space
31 First sublayer
32 Second sublayer
4 Metal layer
40 Contact layer
41 First sub-region of the metal layer/sub-region of the contact layer
42 Second sub-region of the metal layer/sub-region of the contact layer
5 Shaped body
50 Shaped body composite
60 Separating trench
61 Contact opening
7 Converter layer 70 Substrate
8 Wiring structure
80 Electrically conductive layer/mirror layer
81 Through-via
82 Connection layer
9 Insulation structure

DETAILED DESCRIPTION

The component may comprise a carrier and a semiconductor body arranged on the carrier. The carrier comprises a front side facing the semiconductor body and a rear side facing away from the semiconductor body. In particular, the carrier is produced directly on the semiconductor body, for instance in the wafer composite at wafer level. This means that the carrier is not produced for instance in a separate production step from the semiconductor body and attached to the semiconductor body, for example, by a connecting layer, but is already applied on the semiconductor body during production thereof. The semiconductor body comprises in particular a first semiconductor layer facing away from the front side of the carrier, a second semiconductor layer facing towards the front side of the carrier and an active layer arranged between the first and second semiconductor layers in a vertical direction. During operation of the component, the active layer is preferably configured to generate or detect electromagnetic radiation. For example, the active layer is a p-n junction zone formed as one layer or as a layer sequence of multiple layers.

A vertical direction means a direction oriented in particular perpendicularly to a main extension surface of the semiconductor body. In particular, the vertical direction is the growth direction of the semiconductor layers of the semiconductor body. A lateral direction means a direction running for instance parallel to the main extension surface of the semiconductor body. In particular, the vertical and the lateral directions are oriented transversely, for instance perpendicularly, to one another.

The carrier can be formed from a shaped body and a metal layer. The metal layer is configured for instance to electrically contact the semiconductor body. The shaped body is preferably electrically insulating and formed for instance from a plastic, e.g. from a polymer such as epoxy or silicone, from a resin or from a printed circuit board material. In particular, the shaped body is formed by deposition of the plastic on the semiconductor body. For example, the metal layer adjoins the shaped body in the lateral direction. It is also possible that the metal layer is completely surrounded by the shaped body in lateral directions in places, for instance.

The metal layer may comprise a first sub-region and a second sub-region electrically separated from the first sub-region. The sub-regions of the metal layer can adjoin the shaped body or can be at least partly surrounded by the shaped body in the lateral direction. In particular, the first sub-region and the second sub-region are assigned to different electrical polarities of the component. The first sub-region can be electrically separated from the second sub-region by the plastic of the shaped body. In particular, the first sub-region of the metal layer is configured to electrically contact the first semiconductor layer of the semiconductor body and the second sub-region to electrically contact the second semiconductor layer of the semiconductor body, or vice versa. Both the shaped body and the metal layer having the sub-regions can be formed directly on the semiconductor body and not, for instance, prefabricated separately from the semiconductor body and then be attached together with the semiconductor. The entire carrier can thus be produced directly on the semiconductor body.

The front side and the rear side of the carrier can each be formed at least in places by surfaces of the shaped body. In particular, the front side is formed in places by surfaces of the shaped body and in places by surfaces of the first and/or second sub-region. On the front side of the carrier, the first sub-region and the second sub-region of the metal layer can be exposed and therefore electrically connectable. The metal layer having the sub-regions can be configured such that the rear side of the carrier is free from a surface of the metal layer. The rear side of the carrier can be formed exclusively by a surface of the shaped body. However, it is also possible that the rear side of the carrier is formed in places by surfaces of the first and/or second sub-region of the metal layer so that the first sub-region and/or the second sub-region can be electrically connectable on the rear side. The electrically connectable surfaces of the sub-regions on the side face or on the rear side of the carrier additionally serve to dissipate heat from the component.

The carrier may have a side face running perpendicularly or obliquely to the rear side of the carrier. In particular, the side face of the carrier is configured as a mounting surface of the component. The mounting surface of the component in this case runs substantially parallel to the growth direction of the semiconductor layers of the semiconductor body. The component can be adjusted such that a main emission direction runs for instance approximately parallel to the side face of the carrier formed as a mounting surface of the component so that the component is preferably formed as a sidelooker. On the side face, the first and/or second sub-region of the metal layer can be formed to be electrically connectable. It is also possible that for instance two or more first and/or two or more second sub-regions of the metal layer are formed to be electrically connectable on the side face of the carrier. By way of the side face formed as a mounting surface, the component can be externally electrically contacted. The component comprises a side face including the side face of the carrier, for example. The side face of the carrier formed as a mounting surface can be formed by surfaces of the shaped body and of the metal layer. The first and/or second sub-region can terminate flush with the shaped body. It is also possible that the side face of the carrier configured as a mounting surface is formed exclusively by a surface of the metal layer. In this case, the component can be electrically contacted with an external voltage source via the mounting surface and for instance additionally via a further side face or additionally via the rear side of the carrier.

At least one of the sub-regions of the metal layer may exhibit singulation traces. Singulation traces are to be understood as specific traces obtained for instance during singulation of a composite into a plurality of components. If the side face of the carrier formed as a mounting surface comprises a surface of the shaped body, the surface of the shaped body can exhibit singulation traces also on the side face. In particular, the first sub-region and/or the second sub-region as well as the shaped body can exhibit singulation traces of the same type. In other words, the singulation traces of the sub-regions of the metal layer and the shaped body were obtained for instance during the same separating process. The overall side face of the carrier formed as a mounting surface here can be formed flat, e.g. free of a step or free of a kink.

The component may comprise a carrier and a semiconductor body arranged on the carrier. The carrier comprises a metal layer and a shaped body formed for instance from a plastic, the carrier having a front side facing towards the semiconductor body and a rear side facing away from the semiconductor body, which are each formed at least in places by a surface of the shaped body. The metal layer contains a first sub-region and a second sub-region, wherein the first and the second sub-region adjoin the shaped body in the lateral direction. The sub-regions are assigned to different electrical polarities of the component, are electrically connectable on the front side of the carrier in the vertical direction and thus configured to electrically contact the semiconductor body. In other words, the sub-regions for instance are not or are not completely covered by the shaped body on the front side of the carrier and are therefore exposed at least in places and can be electrically connected on the front side of the carrier for instance to a contact structure of the component to electrically contact the semiconductor body. The carrier has a side face running perpendicularly or obliquely to the rear side of the carrier. The side face here is formed as a mounting surface of the component, at least one of the sub-regions being electrically connectable via the side face. The at least one of the sub-regions of the metal layer additionally exhibits singulation traces, for instance on the side face. It is also possible that both the first and the second sub-region are formed to be electrically connectable on the side face formed as a mounting surface. The sub-regions here can each be covered by an electrically conductive protective layer or solder layer arranged on the side face.

In such a configuration of the component, the component can for instance be mechanically attached to and electrically contacted with a circuit board on the side face. The total installation height of the component in this case is not the total height of, for instance, a vertical height of the carrier and a vertical height of the semiconductor body but a lateral width of the component, which is oriented for instance transversely, in particular perpendicularly, to the growth direction of the semiconductor body. The total installation height can therefore be adjusted more easily during production of the component since, in contrast to the vertical dimension of the component, the lateral dimension is set for instance only during a singulating process. In particular, the total installation height of the component measured for instance along a direction oriented perpendicularly to the mounting surface, can be 0.1 mm to 0.5 mm, preferably 0.1 mm to 0.35 mm. Such flat sidelookers can be used for instance as backlighting components in smartphones or tablets.

By configuring the component as a sidelooker, a proportion of a radiation exit surface of the component can be configured to be particularly large relative to the overall surface of the component. Compared to conventional components, the component described herein can have a particularly small margin composed for instance of a plastic, for example, a resin or printed circuit board material, in a top view of the radiation exit surface. The shaped body here can entirely surround the semiconductor body in lateral directions, for instance. Side faces of the semiconductor body here can be partly or completely covered by the shaped body.

The semiconductor body has a radiation passage surface facing away from the carrier wherein, in a top view of the carrier, the radiation passage surface can be framed in lateral directions by the plastic forming the shaped body, at least in places. In a top view of the carrier, the plastic can have a margin with a lateral width of 5 µm to 30 µm, for instance 5 µm to 20 µm, e.g. 5 µm to 15 µm. This margin can entirely surround the radiation passage surface. In these cases, the shaped body has a lateral cross section which is greater than a lateral cross section of the semiconductor body. The shaped body here can be attached on and optionally around the semiconductor body such that the shaped body projects beyond the semiconductor body at the sides in all lateral directions so that the component has a circumferential margin around the semiconductor body in a top view of the carrier, the margin being formed from the plastic forming the shaped body. The side faces of the semiconductor body here can be partly or completely covered by the plastic.

The first sub-region and the second sub-region of the metal layer may be formed such that they differ from one another recognizably in terms of at least one feature, for instance in terms of their geometry or their spatial dimension, to mark their respective electrical polarity. For example, the sub-regions assigned to the different electrical polarities of the component can have different shapes or different sizes for instance on the side face or on the rear side of the carrier. Based on these recognizable, and in particular externally visible, differences, different sub-regions of the metal layer can be clearly assigned to different electrical polarities of the component. This facilitates the electrical contacting of the component during its use.

The component may be in the form of an optoelectronic device. In this case, the device can be in the form of an actuator (transmitter) or a detector (receiver) or a combination of at least one actuator and at least one detector (opto-coupler). In particular, the component is configured as a light-emitting diode (LED).

The component may have a stabilizing layer between the carrier and the semiconductor body for the purpose of mechanical stabilizing. The stabilizing layer can be configured to electrically contact the semiconductor body, wherein at least one of the sub-regions of the metal layer electrically connects to the further metal layer. In particular, the stabilizing layer can comprise a first sublayer and a second sublayer electrically separated from the first sublayer. The first sublayer here can electrically connect to the first sub-region and the second sublayer to the second sub-region, or vice versa. Preferably, at least one of the sublayers, for instance the first sublayer, has a comb-like, toothed structure. The other one of the sublayers, for instance the second sublayer, can extend into the comb-like, toothed structure in the lateral direction so that the component is mechanically reinforced or mechanically stabilized along all lateral directions. In particular, both sublayers of the stabilizing layer can each have a comb-like, toothed structure, the structures of the sublayers being intermeshed but spaced apart and thereby electrically separated from one another. As a result, the stabilizing layer therefore comprises for instance intermeshed comb or finger structures which reduce the risk of a fracture for instance in the event of a flexural load on the component. Compared to conventional sidelookers, therefore, the risk of fracture by bending or strain (warpage problem) can be significantly reduced.

The component may have a converter layer on a surface of the semiconductor body facing away from the carrier. The converter layer can contain a converter material capable of converting electromagnetic radiation of a first peak wavelength to electromagnetic radiation of a second peak wavelength. In particular, the active layer emits electromagnetic radiation with the first peak wavelength during operation of the component, the first peak wavelength being lower than the second peak wavelength converted by the converter layer.

In our method of producing a plurality of components, a composite may be prepared, the composite comprising a semiconductor layer stack and a contiguous shaped body composite composed of a plastic arranged on the semiconductor layer stack. The semiconductor layer stack can comprise a plurality of semiconductor layers deposited for instance by an epitaxial method on a growth substrate composed in particular of sapphire. The semiconductor layer stack here is severable into a plurality of semiconductor bodies. The semiconductor bodies can each comprise a first semiconductor layer, a second semiconductor layer and an active layer arranged between the first and second semiconductor layers in the vertical direction. The shaped body composite can be formed by deposition of the plastic on the semiconductor layer stack, for instance by a molding method or by pressing the plastic onto the semiconductor layer stack.

For example, the plastic is a castable polymer, for instance resin, epoxy or silicone, deposited on the semiconductor layer stack preferably by a molding method. In this case, the shaped body is for instance a molded body. A molding method means in general a method by which a molding compound can be configured according to a predefined shape and, if necessary, cured. In particular, the term "molding method" includes molding, film-assisted molding, injection molding, transfer molding and compression molding. Alternatively, the plastic can be a printed circuit board material in particular reinforced with glass fibers, pressed onto the semiconductor layer stack. The castable polymer can also be filled with glass beads, for instance with silicon oxide or titanium oxide. The glass beads here can have various grain sizes. The glass fibers and/or glass beads can provide the shaped body with additional mechanical reinforcement. A coefficient of thermal expansion of the shaped body can also be adapted to the coefficient of thermal expansion of the metal layer or of the semiconductor body by the addition of glass beads.

A plurality of contact layers may be formed on the semiconductor layer stack to electrically contact the semiconductor bodies. The contact layers are formed in particular such that, in a top view, they each overlap with at least two adjacently arranged semiconductor bodies. Preferably, the contact layers are deposited on the semiconductor layer stack after forming the shaped body composite. Contact openings can be formed in the shaped body composite here. Alternatively, it is also possible to form the contact layers first and deposit the shaped body composite on the semiconductor layer stack in a subsequent method step. After forming the contact layers, the composite can be singulated into a plurality of components. The contact layers here can be cut in areas between the adjacently arranged semiconductor bodies for instance to form sub-regions of the metal layer of the components to be produced. In the cut areas, the contact layers or sub-regions exhibit singulation traces.

The singulated components can each comprise a semiconductor body and a carrier, the semiconductor bodies of the components originating for instance from the semiconductor layer stack. The carrier of the respective component comprises a shaped body and a metal layer, the shaped body originating for instance from the shaped body composite. The metal layer comprises in particular two sub-regions to electrically contact the associated semiconductor body. The two sub-regions of the metal layer originate in particular from different cut contact layers. At least one of the sub-regions of the metal layer can be formed to be electrically connectable on a side face of the carrier for instance at a cut area of the associated contact layer. On the side face of the carrier, therefore, the sub-regions can exhibit singulation traces. Singulation traces here are understood to be, for instance, traces on the side face of the carrier obtained during singulation of the composite into the plurality of components. These traces can be characteristic traces of a mechanical separating process, for instance a sawing, scribing or breaking process, or a chemical separating process, for instance an etching process, or a laser separating process. Both the shaped body and the sub-regions of the metal layer can exhibit singulation traces, in particular characteristic separating traces of a corresponding separating process, on side faces of the carrier or on side faces of the component.

In particular, the metal layer of the carrier comprises at least one first sub-region to electrically contact the first semiconductor layer and at least one second sub-region to electrically contact the second semiconductor layer. The metal layer can also comprise a plurality of, for instance two, first sub-regions and/or a plurality of, for instance two, second sub-regions.

A layer is electrically connectable on a side face if the layer can be electrically connected to an external voltage source, for instance, via the side face. This layer can be exposed or covered by an electrically conductive layer on the side face, at least in places. The electrically conductive layer can for instance comprise a precious metal and can in particular be in the form of a solderable layer. The electrically conductive layer can be deposited on the side face by an electroplating or electroless method or by an immersion method or a physical vapor deposition method (PVD) such as sputtering.

To mechanically stabilize the components to be produced, a plurality of stabilizing layers may be formed on the semiconductor layer stack before the shaped body composite and the contact layers are formed. Preferably, the plurality of stabilizing layers are deposited on the semiconductor layer stack by an electroplating method, in particular in a patterned manner. After deposition, the stabilizing layers can be present in patterned form, the stabilizing layers being laterally spaced apart from one another and in particular each assigned to a semiconductor body and therefore to a component to be produced. In particular, each of the stabilizing layers is a nickel layer. Each metal layer here can comprise sublayers provided to electrically contact the associated semiconductor body.

The plastic may be molded or pressed onto the semiconductor layer stack to form the shaped body composite. For the at least partial exposure of the stabilizing layers, contact openings can be formed in the shaped body composite for instance by a mechanical milling process, a laser drilling or laser ablation process or a sawing process. It is also possible to form the contact openings by dry chemical etching processes. The stabilizing layers can act as stop layers during formation of the contact openings. In particular, the stabilizing layers each have a vertical thickness greater than or equal to 10 μm. In particular, the contact openings are each formed in regions between the semiconductor bodies in the lateral direction. The contact layers can be formed in the contact openings in a subsequent method step.

The contact layers may be deposited on the semiconductor layer stack, and in particular in the regions of the contact openings by an electroplating method. Initially in this case, a starting layer for the subsequent electroplating can be deposited on the semiconductor layer stack for instance by sputtering, evaporation or wet chemical metal seeding, for instance palladium seeding. The contact layers here can be formed in a patterned manner, for instance with the aid of a photoresist. Alternatively, it is also possible that a contact layer is deposited on the semiconductor layer stack in a planar manner and patterned into a plurality of contact layers in a subsequent method step. In particular, the contact layers are formed by deposition of copper.

The method described above is particularly suitable for producing a component as described here. Features described in connection with the component can therefore also be referred to for the method and vice versa.

Further advantages, preferred structures and developments of the method and the component emerge from the examples explained below in association with FIGS. 1A to 4C.

Identical or equivalent or equivalently acting elements are provided with the same reference numbers in the figures. The figures are all schematic illustrations and therefore not necessarily true to scale. Rather, for the sake of clarity, the size of relatively small elements, and in particular layer thicknesses, may be exaggerated.

FIG. 1A illustrates a composite 200. In particular, the composite 200 is a wafer composite. The composite 200 comprises a semiconductor layer stack 20. The semiconductor layer stack 20 is arranged on a substrate 70. In particular, the substrate 70 is a growth substrate, for instance a sapphire substrate, the semiconductor layer stack 20 being deposited on the growth substrate in layers, in particular by an epitaxial method. The growth direction is oriented in particular perpendicularly to a main extension plane of the substrate 70. The semiconductor layer stack 20 has a first main surface 201 facing towards the substrate 70 and a second main surface 202 facing away from the substrate 70. The semiconductor layer stack 20 comprises a first semiconductor layer 21, a second semiconductor layer 22 and an active layer 23 arranged between the semiconductor layers. In particular, the first main surface 201 can be formed by a surface of the first semiconductor layer 21 and the second main surface 202 by a surface of the second semiconductor layer 22. The semiconductor layer stack 20 is therefore delimited in the vertical direction for instance by the main surfaces 201 and 202.

On the side of the second main surface 202 of the semiconductor layer stack, a wiring structure 8 is formed. The wiring structure 8 is configured in particular to electrically contact the semiconductor layer stack 20, wherein the wiring structure 8 can for instance be electrically connected directly or indirectly to various semiconductor layers of the semiconductor layer stack 20. The wiring structure 8 here can comprise substructures electrically separated from one another (not illustrated here), each of which electrically connects to one of the semiconductor layers 21 and 22. In particular, a substructure of the wiring structure 8 adjoins the second semiconductor layer 22 and thereby electrically connects to this layer. A further substructure of the wiring structure 8 can take the form of a through-via extending for instance from the second main surface 202 throughout the second semiconductor layer 22 and the active layer 23 to electrically contact the first semiconductor layer 21. To supply the first semiconductor layer 21 uniformly with current, the wiring structure 8 can have a plurality of these through-vias. The radiation exit surface 101 of the component 100 can therefore be formed to be free from electrical contacts.

The composite 200 can comprise an insulation structure (not illustrated here) configured to electrically separate substructures of the wiring structure 8 having different electrical polarities from one another. The insulation structure can also extend into the semiconductor layer stack 2 and electrically separate the through-via or through-vias from the second semiconductor layer 22 and the active layer 23.

Figure 1B:
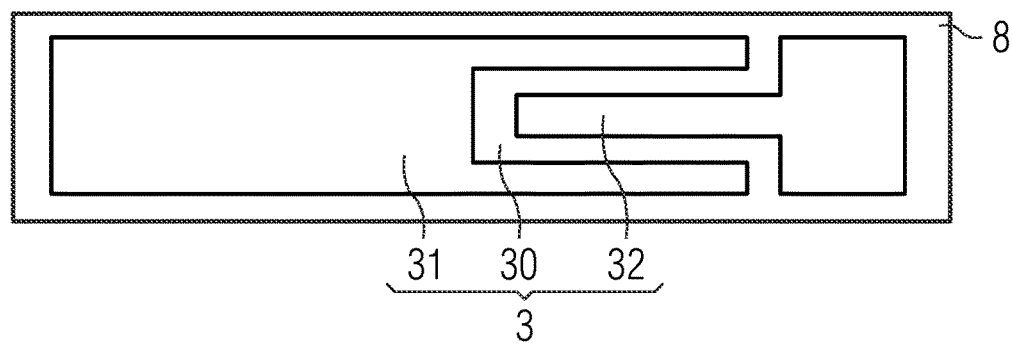

A stabilizing layer 3 is formed on the side of the second main surface 202. In particular, the wiring structure 8 is deposited on the semiconductor layer stack 20 before the stabilizing layer 3 is formed so that the wiring structure 8 is arranged between the semiconductor layer stack 20 and the stabilizing layer 3 in the vertical direction. The stabilizing layer 3 can comprise a metal, for instance nickel. In particular, the stabilizing layer 3 is deposited on the semiconductor layer stack 20 by photo-technology using a photomask that can be formed, for example, by a patterned photoresist layer. With the photomask, the stabilizing layer 3 can be deposited on the semiconductor layer stack 20 in a patterned manner, for instance. In particular, the stabilizing layer 3 can be electrically connected to the wiring structure 8. FIG. 1B shows a possible configuration of the stabilizing layer 3 on the wiring structure 8. The stabilizing layer 3 can comprise a first sublayer 31 and a second sublayer 32 spaced apart laterally from the first sublayer 31 for instance by an intermediate space 30. As a result of the spatial separation, the first sublayer 31 is electrically separated from the second sublayer 32. The first sublayer 31 can be electrically connected to the first semiconductor layer 21 via the wiring structure 8, for instance via a substructure of the wiring structure 8 in the form of a through-via. The second sublayer 32 can be electrically connected to the second semiconductor layer 22 via a further substructure of the wiring structure 8. The stabilizing layer 3 illustrated in FIG. 1B has a comb or finger structure, in which the first sublayer 31, as shown for instance in FIG. 1B, has two lateral projections and a recess arranged between the two lateral projections. The second sublayer 32 has a lateral projection extending into the recess of the first sublayer 31 in the lateral direction.

Deviating from FIG. 1B, the sublayers 31 and 32 can each have a plurality of lateral projections and a plurality of recesses arranged between the projections. As a result of the comb-like structures of the sublayers 31 and 32 intermeshed in the lateral direction without forming an electrical contact with one another, the sublayers 31 and 32 can still be assigned to different electrical polarities of the component 100 to be produced. Such a configuration of the stabilizing layer 3 is particularly advantageous since the stabilizing layer 3 on the one hand contributes to mechanical stabilizing of the semiconductor layer stack 20 or the component 100 to be produced and on the other hand reduces the risk of a fracture with regard to a mechanical bending load, for instance on the semiconductor layer stack 20 or on the component 100 to be produced. The component 100 to be produced therefore has no mechanical weak point in the region of the intermediate space 30 since the component 100 to be produced has no area in the region of the intermediate space 30 which is not mechanically supported by the sublayers 31 and 32 or the lateral projections of the sublayers 31 and/or 32. The risk of a fracture of the finished component 100 is thereby largely reduced.

Figure 1C:
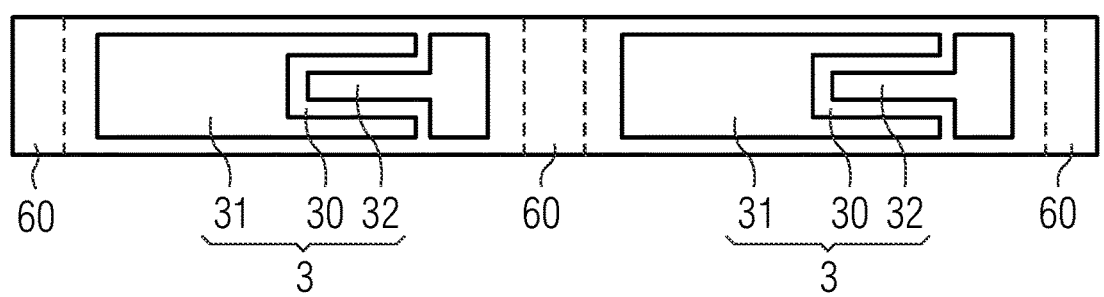

On the semiconductor layer stack 20, a plurality of the stabilizing layers 3 can be formed (FIG. 1C). The stabilizing layers 3 with the sublayers 31 and 32 are in particular spaced apart from one another in the lateral direction. In particular, the stabilizing layers 3 are formed on the semiconductor layer stack 20 such that they are each assigned to one of the components to be produced. The semiconductor layer stack 20 here can be capable of being severed into a plurality of semiconductor bodies 2, wherein the semiconductor bodies 2 can each be assigned to one of the components 100 to be produced. Thus, each of the stabilizing layers 3 can be assigned to a semiconductor body 2.

FIG. 1C shows that a separating trench 60 is formed in the lateral direction, for instance between two adjacent stabilizing layers 3. The separating trench 60 can extend into the semiconductor layer stack 20 in the vertical direction. In particular, the trench 60 can extend from the second main surface 202 to the first semiconductor layer 21 or to the first main surface 201. The substrate 70 can be exposed in the region of the separating trench 60 in places. It is also possible for a plurality of the separating trenches 60 to be formed in the semiconductor layer stack 20. After the separating trenches 60 are formed, the semiconductor layer stack 20 is subdivided into a plurality of semiconductor bodies 2 arranged side by side, the semiconductor bodies 2 being spaced apart from one another by the separating trenches 60. It is also possible that the semiconductor bodies 2 are still connected to one another by a layer, for instance by the first semiconductor layer 21 or a buffer layer arranged between the substrate 70 and the first semiconductor layer 21, even after the separating trenches are formed.

Figure 1D:
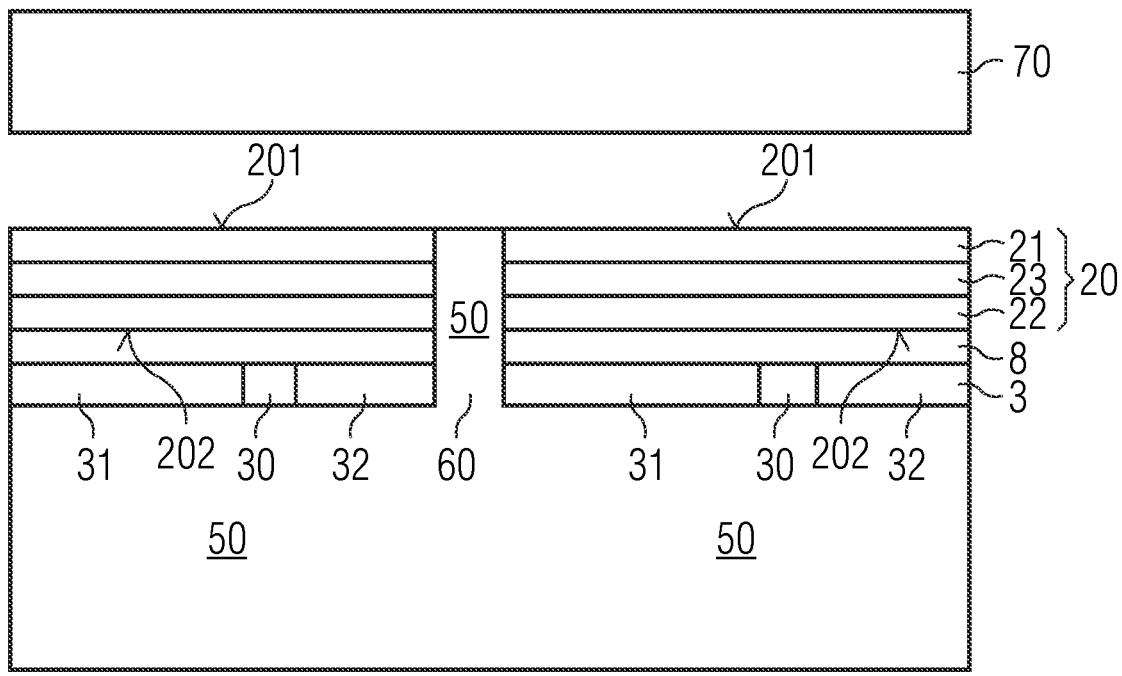

In FIG. 1D, a shaped body composite 50 is formed on the semiconductor layer stack 20 on the side of the second main surface 202. The shaped body composite 50 here can be formed contiguously. In particular, the shaped body composite is deposited on the semiconductor layer stack 20 by deposition of a plastic, for instance by a molding method or pressing, for instance by hot-pressing. The plastic here can be a castable polymer, for instance an epoxy resin or silicone, or a printed circuit board material, for example, FR4. The printed circuit board material is preferably reinforced with glass fibers. In particular, the plastic is a glass-epoxy material. For example, the shaped body composite 50 is formed using a glass-fiber-reinforced printed circuit board material or a glass-bead-filled resin. The glass beads can have various sizes. FIG. 1D shows that the separating trench 60 or the plurality of separating trenches 60 is/are filled by the plastic of the shaped body composite 50. In other words, the separating trenches 60 can be formed before the shaped body composite 50 is formed. Each intermediate space 30 between the sub-regions 31 and 32 of the stabilizing layer 3 can also be filled with the plastic of the shaped body composite 50. As a result of the filling of the separating trenches 60, side faces of the semiconductor bodies 2—depending on the depth of the separating trenches—can be partly or completely covered by the plastic or the shaped body composite 50.

In a further method step, in particular after deposition of the stabilizing layer 3 and/or of the shaped body composite 50, the substrate 70 can be removed from the semiconductor layer stack 20 and, therefore, from the components 100 to be produced, for instance by a mechanical method, an etching method or by a laser lift-off method. A surface of the semiconductor layer stack 20 or the semiconductor bodies 2 exposed thereby can be roughened or patterned to increase the coupling or outcoupling efficiency of the component 100 to be produced. This exposed surface can be the first main surface 201 or a surface of a buffer layer. The patterned surface here can act as a radiation exit surface of the component to be produced.

After removal of the substrate 70, a converter layer 7 can be deposited on the semiconductor layer stack 20 on the side of the first main surface 201. The converter layer 7 can also be formed on the radiation exit surface of the respective component at a later point in time, for instance immediately before singulation of the composite 200 or after singulation of the composite 200. Various methods are suitable for depositing the converter layer on the radiation exit surface such as sedimentation, "dam and fill", coating such as spray coating or EPD (electrophoretic deposition) and so on. The converter layer can also be formed as a ceramic converter. The converter material can be embedded in a ceramic layer, for example. It is also possible that a terminating passivating layer, for instance an electrically insulating layer, is arranged between the converter layer 7 and the semiconductor layer stack 20 or the semiconductor body 2 in the vertical direction.

Figure 1E:
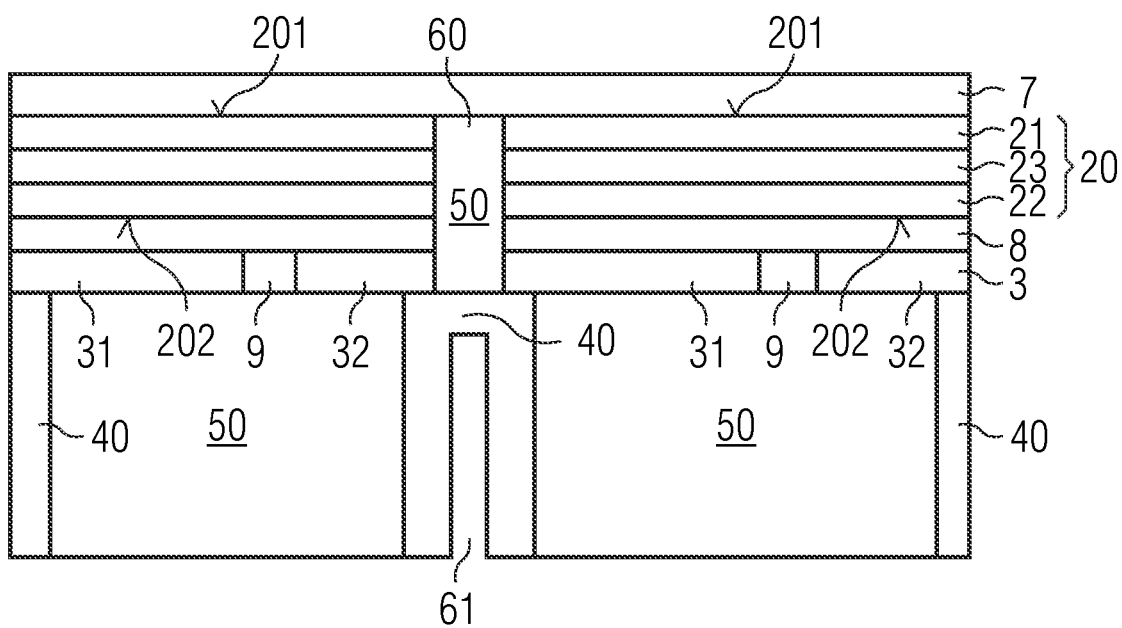

In FIG. 1E, at least one contact opening 61 or a plurality of contact openings 61 is/are created in the shaped body composite 50. This can take place by a mechanical milling process, a laser ablation process, a sawing process or an etching process, for instance a dry chemical etching process. In particular, the contact opening 61 is formed sufficiently deeply that for instance the stabilizing layer 3 is partly exposed in the contact opening 61. Preferably, the contact opening 61 is formed for instance in the region of an separating trench 60 sufficiently widely that, in particular, two adjacent stabilizing layers 3 are exposed in the same contact opening 61. For example, sublayers 31 and/or 32 of different stabilizing layers 3 are exposed in the same contact opening 61. The contact opening 61 here can be formed in the shape of a cylinder, a truncated cone or an elongated hole along vertical edges of the components 100 to be produced. A plurality of these contact openings 61 can also be formed in the shaped body composite 50.

In the contact opening 61, a contact layer 40 is formed using a metal, for instance copper. The contact layer 40 is formed such that it is in an electrical contact with the stabilizing layer 3 or stabilizing layers 3. The contact opening 61 here can be filled with the contact layer 40. Preferably, however, the contact layer 40 is deposited on the sublayers 31 and 32 of the stabilizing layers 3 and/or on the shaped body composite 50 in the region of the contact opening 61 by a coating method, in particular by an electroplating method. For deposition of the contact layer 40 by electroplating, a starting layer (seed layer) can be deposited beforehand on the shaped body composite 50 or on the stabilizing layers 3 in the region of the contact opening 61 for instance by sputtering, evaporation, wet-chemical metal seeding or another method. It is also possible for a photoresist layer to be deposited on the shaped body composite 50, namely in areas that are not to be covered by the contact layer 40.

Deviating from FIG. 1E, it is also possible to form the contact layer 40 on a rear side of the shaped body composite 50 facing away from the semiconductor bodies 2. A back-metallizing of this type acts in particular as a rear thermal pad of the component 100 to be produced. A plurality of the contact layers 40 can also be formed on the shaped body composite 50 and/or in regions of the contact openings 61.

In a subsequent method step, the composite 200 will be singulated into a plurality of components 100 in particular along the separating trenches 60 and/or the contact openings 61. The contact layer 40 or the plurality of contact layers 40 here can be cut in areas between the adjacent semiconductor bodies 2 or between the adjacent components 100 to be produced. As a result of cutting the contact layers 40, the component 100 to be produced can have cut surfaces of the contact layer 40 on its side face. By way of the cut surface of the contact layer 40, an external electrical contact can be made with the finished component 100 for instance on its side face 10. The side face 10 of the finished component 100 can therefore be configured as a mounting surface. In particular, the cut contact layers 40 form sub-regions 41 and 42 of a metal layer 4 of the finished component 100, the component 100 being formed such that an external electrical contact can be made by way of the metal layer 4 for instance via its side face. As a result of cutting the contact layer 40 during singulation, the finished component 100 can be electrically contacted on its side face without any further processing steps. During singulation, the composite can be cut through the shaped body composite 50 for instance by a sawing process. In this case, the thinnest possible saw blade should be used so that as little as possible of the semiconductor body 2 is lost.

The contact layer 40 or the plurality of contact layers 40 can in particular be finished to form a solderable surface, in particular by forming a protective layer or a solderable layer preferably comprising nickel, tin, copper, titanium, palladium, platinum, silver and/or gold. In particular, the solderable layer is a CuSn, NiSn, CuNiSn, TiPtAu, NiAu, NiSn, CuNiSN, NiAg, CuNiAg, CuAg or NiPdAu layer. The solderable layer can also be a SnAgCu layer (SAC solder), AuSn, CuAgNi layer or a pure Ag, Cu or Au layer. The protective layer or the solderable layer can be formed on the contact layer 40 by an electroplating or electroless method or an immersion method before singulation of the composite 200, after singulation of the composite 200 or during singulation of the composite 200. Preferably, the solderable layer is an ENEPIG layer (Electroless Nickel Electroless Palladium Immersion Gold). In particular, the composite 200 can be singulated in two steps, wherein the protective layer or the solderable layer is formed after a first step, for instance after the contact layer 40 or the plurality of contact layers 40 is/are cut into a plurality of sub-regions, and the composite 200 is singulated into a plurality of components 100 in a second step after formation of the protective layer or the solderable layer.

Figure 1F:
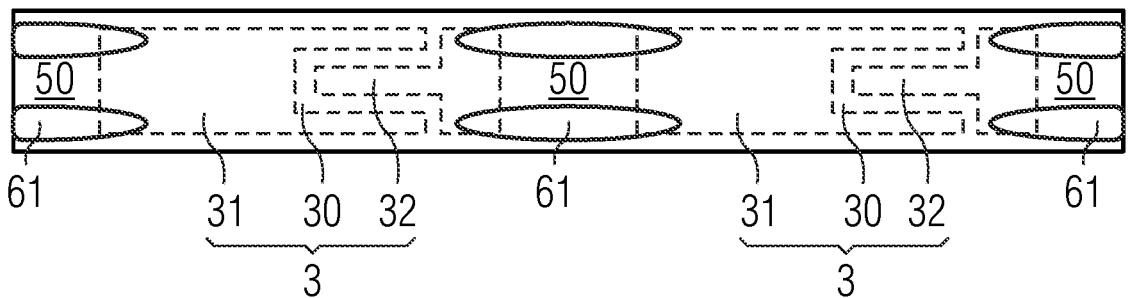
Figure 1G:
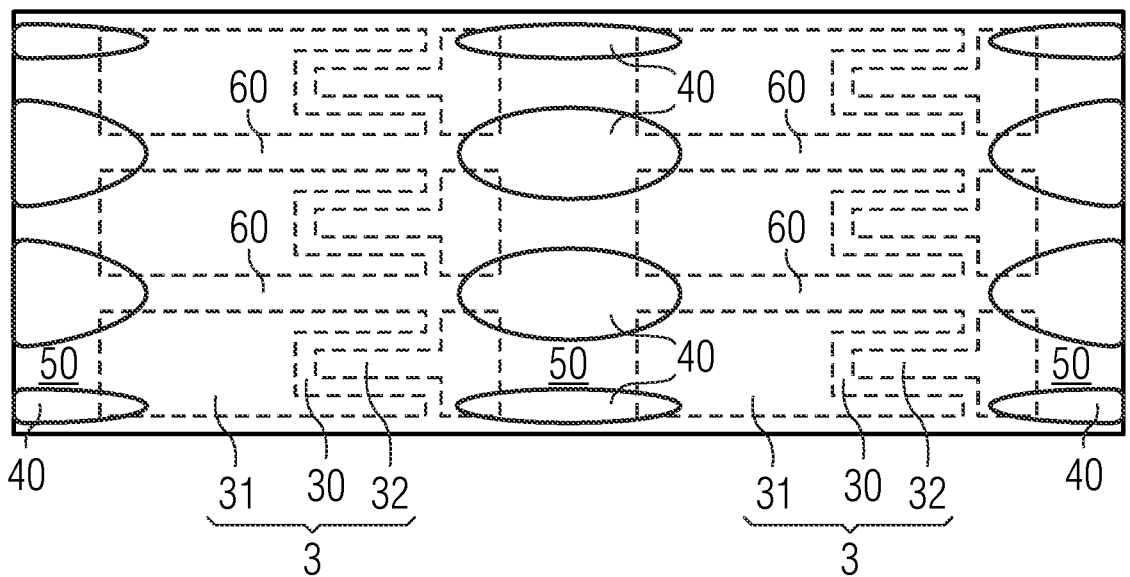
Figure 1H:
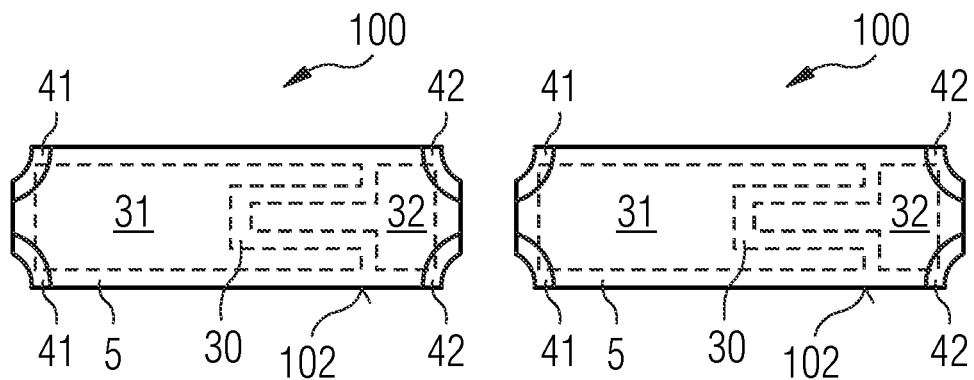

In FIGS. 1F to 1H, further examples of a method of producing a plurality of components 100 are illustrated. In FIG. 1F, a plurality of contact openings 61 are formed for instance in the regions of the separating trenches 60, wherein two adjacent stabilizing layers 3 are partly exposed in the respective contact openings 61. In FIG. 1F, two contact openings 61 are formed between every two adjacent semiconductor bodies 2 such that the sublayers 31 and 32 of the stabilizing layers 3 are each partly exposed in two different contact openings 61.

In FIG. 1G, the contact openings 61 are each filled or coated with an electrically conductive material to form a contact layer 40. After singulation of the composite 200, the finished components 100 each comprise two first sub-regions 41 and two second sub-regions 42. The sub-regions 41 and 42 are each arranged on opposite edges of the carrier 1 of the produced component 100. Thus, the first sub-region 41 and the second sub-region 42 are electrically connectable on opposite edges of the carrier 1.

The example illustrated in FIG. 1G substantially corresponds to the example described in FIG. 1F. In contrast thereto, it shows that the composite 200 comprises a plurality of separating trenches 60 that subdivide the composite 200 into various sub-regions each having a stabilizing layer 3. The contact opening 61 can be formed such that for instance four adjacent stabilizing layers 3 are exposed in some areas in a common contact opening. A common contact layer 40 formed in the common contact opening can therefore have overlaps with four stabilizing layers 3. The composite 200 can comprise a plurality of these common contact openings 61 and common contact layers 40.

In FIGS. 1G and 1H, it is indicated that the contact opening 61 is coated and not filled with an electrically conductive material to form the contact layer 40. In particular, a bottom surface and internal walls of the contact opening 61 are coated with the electrically conductive material such that the resulting contact layer 40 reproduces a contour of the contact opening 61. This contour can be U-shaped, as illustrated in FIG. 1E. As a result of the coating method, the contact layer 40 has a comparatively thin vertical thickness within the contact opening 61 so that the contact layer 40 can be cut more easily during singulation. The sub-regions 41 and 42 of the metal layer 4 of the carrier 1 obtained during singulation of the contact layers 40 each have a shape which, in a top view of a rear side 102 of the component 100, reproduces part of the shape of the contact opening 61. FIG. 1H, for example, shows a curved shape of the sublayers 41 and 42 at the edges of the carrier 1 of the component 100, wherein the curved shape is, for instance, part of an ellipse or of a circle.

FIGS. 2A to 2F schematically show various examples of forming contact layers 40 before singulation of the composite 200. The rectangles illustrated by dotted lines represent the components 100 to be produced, the semiconductor bodies 2 of which are arranged for instance in a plurality of columns and rows by a plurality of separating trenches 60. The separating trenches 60 here can be filled with a material of the shaped body composite 50. The contact layers 40 are configured as strips or islands, each connecting two semiconductor bodies 2 arranged side by side. In other words, in a top view the contact layers 40 each cover at least two adjacently arranged semiconductor bodies 2. A separating trench 60 here can be completely or partly covered by an associated contact layer 40 between the two semiconductor bodies or between two rows or columns of semiconductor bodies. In particular, each of the semiconductor bodies 2 is partly covered by at least two, for instance precisely two or precisely four, different contact layers 40.

In FIG. 2A, a contact layer 40 or a plurality of contact layers 40 can have overlaps with two adjacent semiconductor bodies 2 or with two rows or columns of semiconductor bodies lying side by side in a top view, completely covering a separating trench 60 arranged between the two adjacent semiconductor bodies or between two adjacent rows or columns of semiconductor bodies 2. Each of the semiconductor bodies 2 has overlaps with precisely two different contact layers 40. During singulation of the composite 200 along the separating trenches 60, components 100 are obtained, each comprising two sub-regions 41 and 42, wherein the two sub-regions 41 and 42 originate from two different contact layers 40. The sub-regions 41 and 42 are obtained for instance during cutting of the contact layers 40, for example, in the regions of the separating trenches 60.

The example illustrated in FIG. 2B substantially corresponds to the example illustrated in FIG. 2A. In contrast thereto, the contact layers 40 are formed as double strips in relation to the semiconductor bodies 2, each connecting two semiconductor bodies 2 lying side by side and only partly covering the separating trench 60 arranged therebetween. In contrast to FIGS. 1A to 1H, the contact layers 40 can have a significantly smaller width. Thus, the contact layers 40 can be cut in a simple manner in the regions of the separating trenches 60. Each of the semiconductor bodies 2 in FIG. 2B is assigned to two contact layers 40 arranged side by side, the semiconductor body 2 completely covering the two contact layers 40 assigned thereto along their entire width in a top view. Unlike FIG. 2A, in which each separating trench 60 has overlaps with at least one contact layer 40, the composite 200 according to FIG. 2B can comprise one or a plurality of parallel separating trenches 60, the separating trench 60 or the plurality of separating trenches 60 being free from overlaps with the contact layers 40.

In FIGS. 2C to 2F, the contact layers 40 are each formed on the composite 200 in the form of an island. The contact layers 40 here, in pairs in each case, can connect two semiconductor bodies 2 arranged side by side or two components 100 to be produced lying side by side.

Figure 2C:
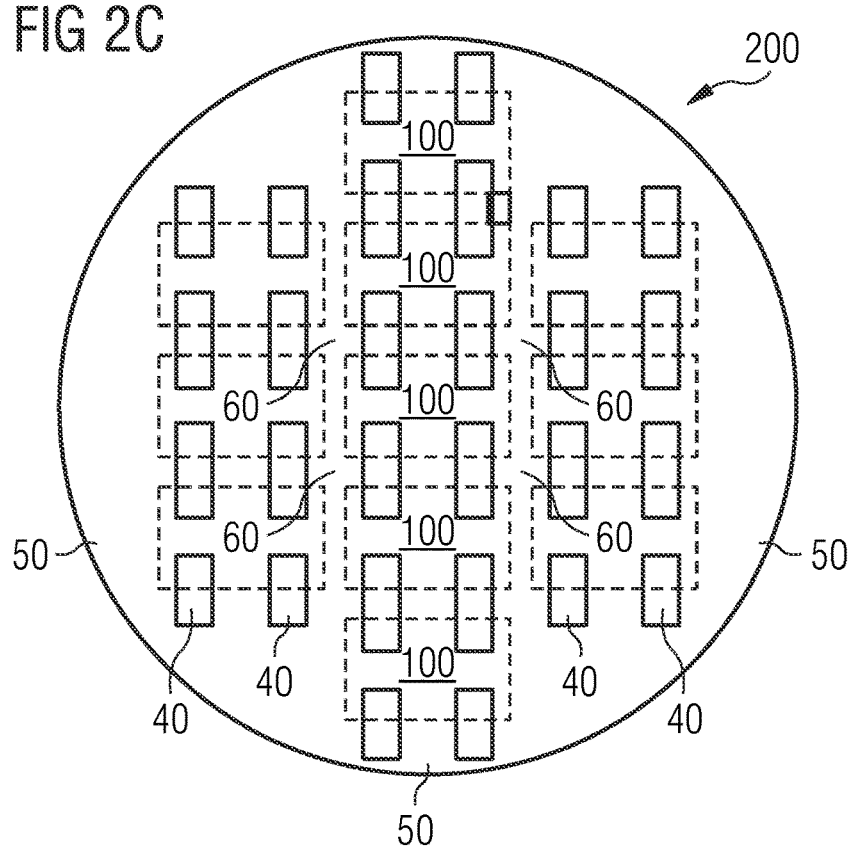

The example illustrated in FIG. 2C substantially corresponds to the example illustrated in FIG. 2B. In contrast thereto, each semiconductor body 2 has overlaps with four different contact layers 40. To this end, the contact layers 40 illustrated in FIG. 2B are formed in a patterned manner such that they are cut in the region of the respective semiconductor body 2 or of the respective component 100 to be produced. After singulation, the components 100 can each comprise a metal layer 4 made up of four sub-regions 41 and 42, the four sub-regions originating from four different contact layers 40.

Figure 2D:
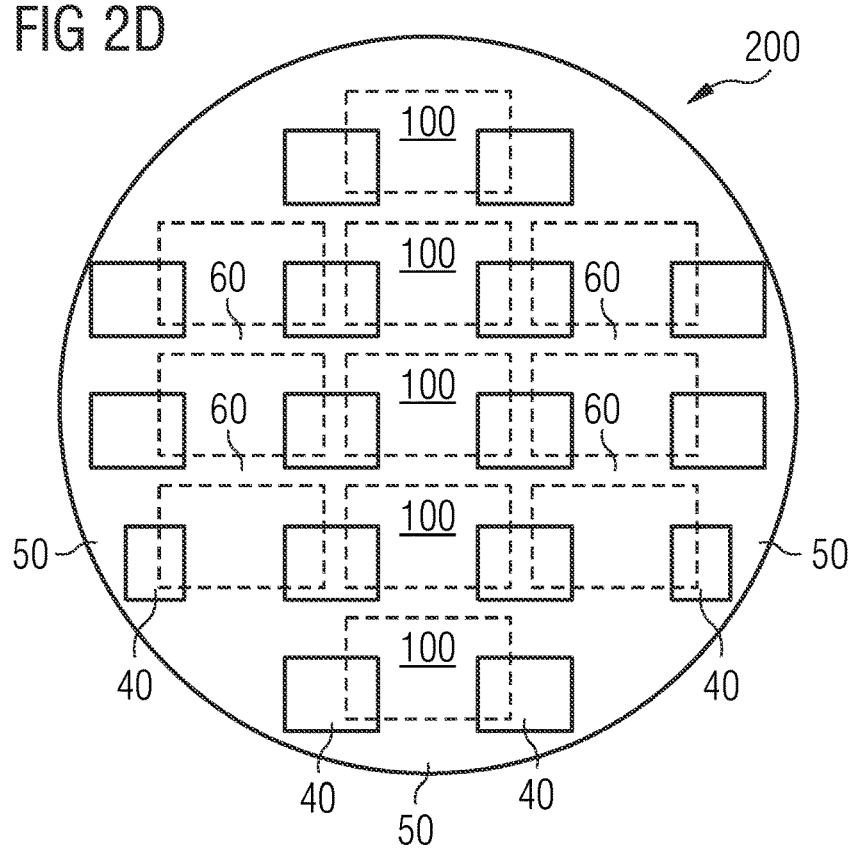

The contact layers 40 illustrated in FIG. 2D are arranged such that, as in FIG. 2C, they only connect two adjacent semiconductor bodies 2. In contrast thereto, in a top view the contact layers 40 each cover corners of the components 100 to be produced so that after singulation, the components 100 are electrically connectable not only on their side faces but also on their corners, in particular on their vertical edges. The sub-regions 41 and 42 obtained by singulation are each electrically connectable in particular on two adjacent side faces of the carrier 1 of the associated component 100.

Figure 2E:
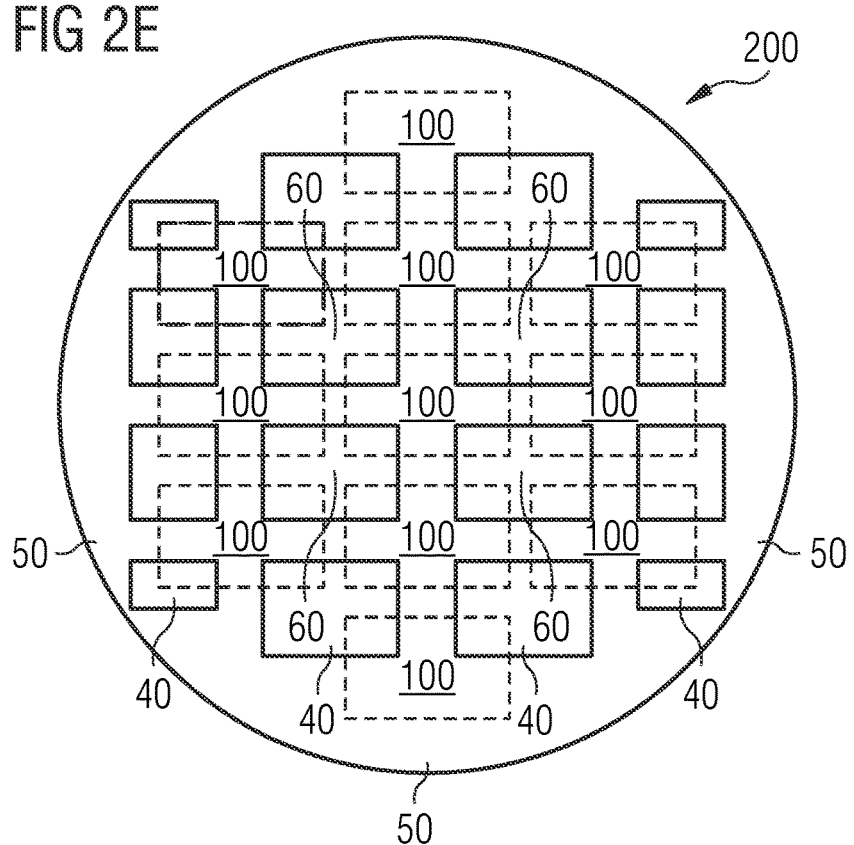
Figure 2F:
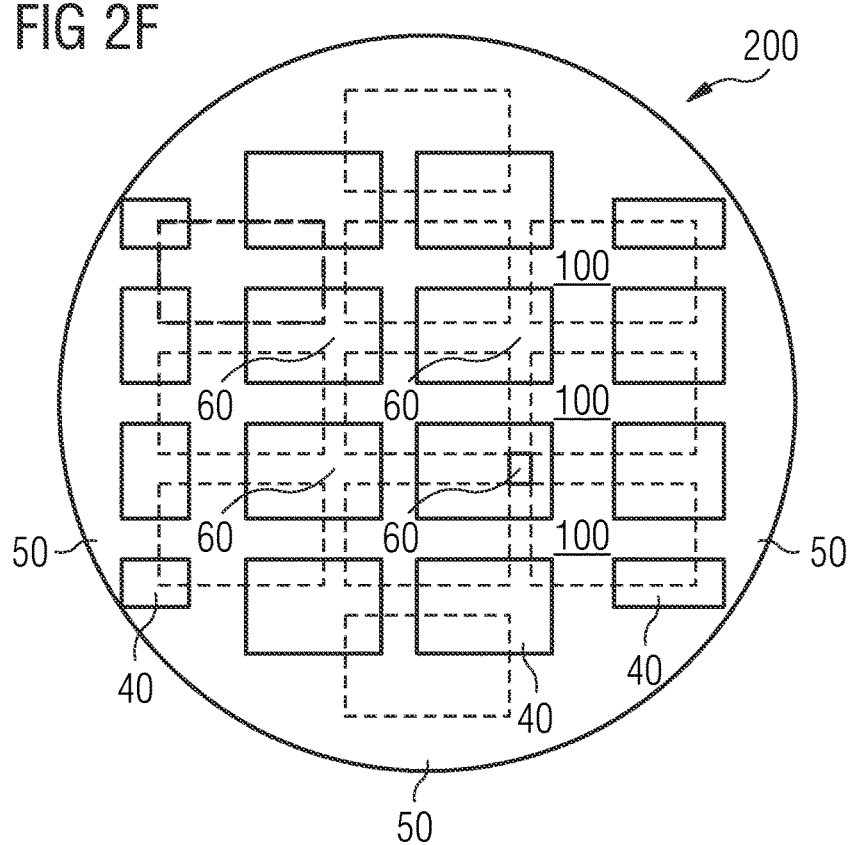

In FIGS. 2E and 2F, the contact layers 40 in the form of islands are arranged such that, in a top view, they each cover or connect four adjacent semiconductor bodies 2 of the four components 100 to be produced. As in FIG. 2D, the contact layers 40 cover the corners of the associated semiconductor bodies 2 in a top view. In contrast thereto, all, in this case four, corners of the respective semiconductor body 2 are covered by four different contact layers 40 arranged side by side. After singulation, the singulated components 100 can each comprise four different sub-regions 41 and/or 42 composed of four different contact layers 40, the different sub-regions each being electrically connectable on a corner or an edge and at the same time on two mutually adjacent side faces of the associated component 100.

In FIG. 2F, the contact layers 40 are arranged such that the components 100 comprise a metal layer 4 with sub-regions 41 and/or 42 after singulation, the sub-regions with different electrical polarities having different shapes, for instance in terms of size or geometry. Thus, different assigned electrical polarities of the sub-regions 41 and 42 are identifiable for instance by the different shapes of the sub-regions 41 and 42 on side faces 10 of the components 100 to be produced.

In all the examples according to FIGS. 2A to 2F, the contact layers 40 can be formed such that the sub-regions of the contact layers 40 obtained after singulation differ from one another in terms of a recognizable feature, for instance a shape that is visible on side faces or rear sides of the components 100 to be produced, to identify their respective electrical polarity.

The contact layers 40 can in addition be formed sufficiently thickly that the components 100 obtained after singulation are electrically connectable both on their side faces 10 and on their rear sides 102. Thus, both a side face 10 and a rear side 102 of the finished component 100 can be configured as a mounting surface of the component. It is also possible that the contact layers 40 are formed only sufficiently thickly in the vertical direction that the rear sides 102 of the components 100 to be produced are for instance free from surfaces of the contact layers 40. To this end, the contact openings 60 can be only partly filled or partly coated. In particular, the contact layers 40 can be formed only within the contact openings 61. In other words, the side faces of the contact openings 61 can be coated with one of the contact layers 40 only in places.

It is also possible in all the examples to produce the shaped body composite 50 in at least two separate steps, the contact layers 40 being formed between the two separate steps. In this case, the separating trenches 60 can be filled in a first method step for instance to form the shaped body composite 50. In a subsequent method step, the contact openings 61 are optionally opened, whereupon the contact layers 40 are formed at least in the regions of the contact openings 61. In a second method step to form the shaped body composite 50, the plastic can additionally be deposited such that the contact layers 40 are completely covered by the shaped body composite 50 in a top view.

FIGS. 3A to 4C show various views of different examples of a component 100 produced in particular by the method described here.

The component 100 comprises a semiconductor body 2 and a carrier 1. The semiconductor body 2 originates in particular from the semiconductor layer stack 20. The carrier 1 is formed from a shaped body 5 and a metal layer 4 with a first sub-region 41 and a second sub-region 42. In particular, the shaped body 5 originates from the shaped body composite 50 during singulation. The sub-regions 41 and 42 are provided to electrically contact the semiconductor body 2 and originate in particular from two different contact layers 40 during singulation, the two different contact layers 40 covering a common stabilizing layer 3 in places and being laterally spaced apart from one another in the region of the common stabilizing layer 3 in a top view. The possibility cannot be ruled out that the two different contact layers 40 connect to one another outside the common stabilizing layer 3, for instance on a lateral margin of the composite 200. The sub-regions 41 and 42 and the contact layers 40 can be formed using the same material, for instance a metal such as copper, or using different materials, for instance different metals.

The carrier has a side face 10 on which the first sub-region 41 and/or the second sub-region 42 is/are electrically connectable. The first and/or second sub-region here can be exposed on the side face 10. It is also possible for the first sub-region 41 and/or the second sub-region 42 to be covered in places or completely by a further metallizing. This metallizing can be formed on the side face 10 as a protective layer or to form a solder surface.

The carrier 1 has a front side 11 facing towards the semiconductor body 2 and a rear side 12 facing away from the semiconductor body 2. In particular, a rear side 102 of the component 100 comprises the rear side 12 of the carrier 1. The front side 11 and/or the rear side 12 can be formed in places by a surface of the shaped body 5 and in places by a surface of the metal layer 4. If the rear side 12 is formed in places by a surface of the metal layer 4, the component 100 can be electrically contacted via the rear side 12.

Figure 3A:
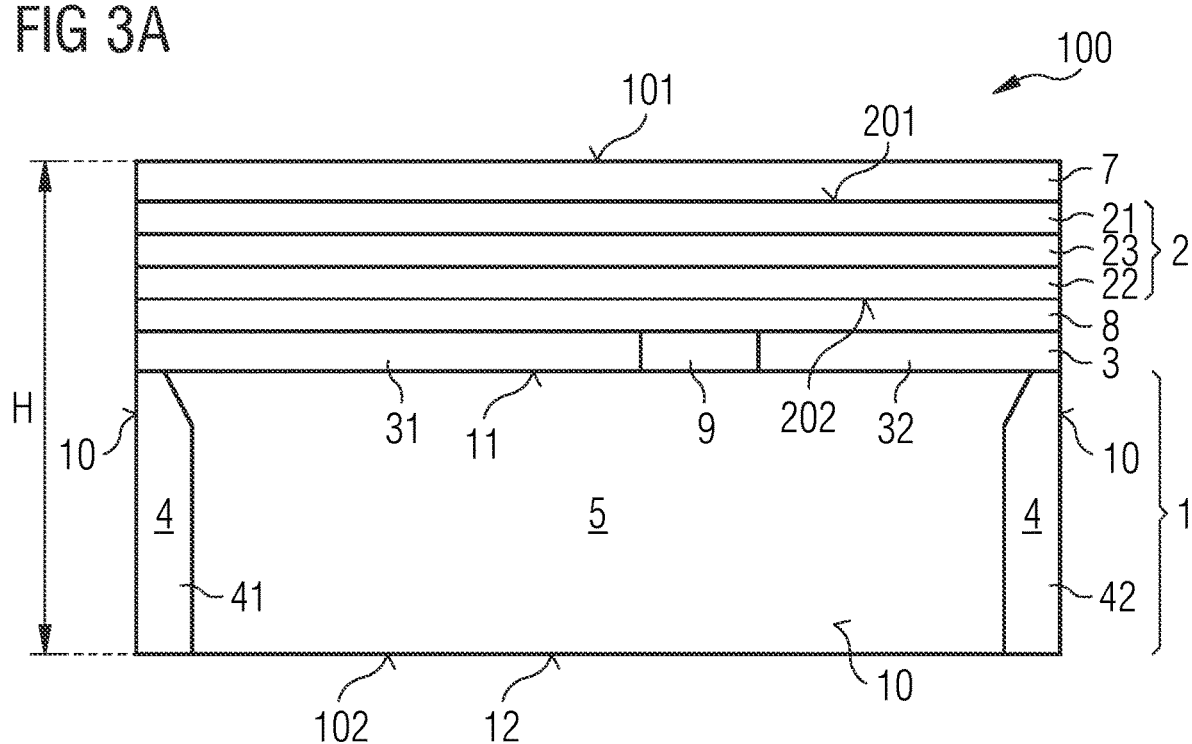
FIGS. 3A to 4C show various examples of a component in sectional views.

In FIG. 3A, the side face 10 is formed in places by a surface of the shaped body 5 and in places by a surface of the first sub-region 41 and in places by a surface of the second sub-region 42. The sub-regions 41 and 42 of the metal layer 4 are in particular assigned to different electrical polarities of the component. By way of the side face 10, therefore, the component 100 can be electrically connected to an external voltage source. In particular, the side face 10 is configured as a mounting surface of the component 100. On the side face 10, the first sub-region 41 and/or the second sub-region 42 can exhibit singulation traces. The shaped body 5 can also exhibit singulation traces on the side face 10.

The component 100 can have a further side face 10 formed for instance by surfaces of the shaped body 5 and the sub-regions 41 and 42. It is also possible that the further side face of the component 100 only comprises surfaces of the sub-regions 41 or 42 with the same electrical polarity. For example, a side face 10 of this type has surfaces of a first sub-region 41 and is free from a surface of a second sub-region 42, or vice versa. The further side face 10 can also be formed exclusively by a surface of a sub-region 41 or 42. In FIG. 3A, the sub-regions 41 and 42 extend from the rear side 12 to the front side 11 of the carrier in the vertical direction. It is also possible that the rear side 12 is free from surfaces of the first and/or second sub-region of the metal layer 4.

Between the carrier 1 and the semiconductor body 2, a stabilizing layer 3 is arranged which comprises for instance a first sublayer 31 and a second sublayer 32 electrically separated from the first sublayer 31. In particular, the sublayers 31 and 32 are spaced apart from one another in the lateral direction, an electrically insulating layer being arranged between the sublayers 31 and 32 in the lateral direction. The electrically insulating layer can be part of an insulation structure 9 or part of the shaped body 5, for example. The stabilizing layer 3 has a vertical thickness which is in particular 5 μm to 30 μm, for instance 5 μm to 20 μm. In particular, the vertical thickness of the stabilizing layer 3 is greater than or equal to 10 μm.

The stabilizing layer 3 can electrically connect to both the metal layer 4 and the semiconductor body 2. In particular, the stabilizing layer 3 electrically connects to the semiconductor body 2 by way of a wiring structure 8. The wiring structure 8 here can comprise substructures with different electrical polarities. By way of a substructure of the wiring structure 8, the second semiconductor layer 22 can electrically connect to the second sublayer 32 of the stabilizing layer 3 and the second sub-region 42 of the metal layer 4. By way of a further substructure of the wiring structure 8, the first semiconductor layer 21 can electrically connect to the first sublayer 31 of the stabilizing layer 3 and the first sub-region 41 of the metal layer 4. A further substructure of this type can be formed for instance as a through-via 81 (FIGS. 3B and 3E), wherein the through-via 81 can extend at least from the second main surface 202 of the semiconductor body 2 through the second semiconductor layer 22 and the active layer 23 into the first semiconductor layer 21. The wiring structure 8 can comprise a plurality of these through-vias 81.

The component 100 according to FIG. 3A comprises a converter layer 7 that can be arranged for instance on the side of the first main surface 201 formed e.g. as a radiation passage surface of the component 100. The converter layer 7 can comprise a converter material that is for instance capable of converting the electromagnetic radiation of a first wavelength generated by the active layer 23 to electromagnetic radiation of a second wavelength, which is higher compared to the first wavelength. The component 100 comprises a radiation exit surface 101. On the radiation exit surface 101 formed for instance by a surface of the converter layer 7, the radiation generated by the active layer and/or the radiation converted by the converter layer 7 is coupled out of the component 100. The radiation passage surface 201 and/or the radiation exit surface 101 can be patterned. The component 100 has a vertical height H, wherein the vertical height H can be at least 300 μm, at least 1 mm or a few millimeters.

Figure 3B:
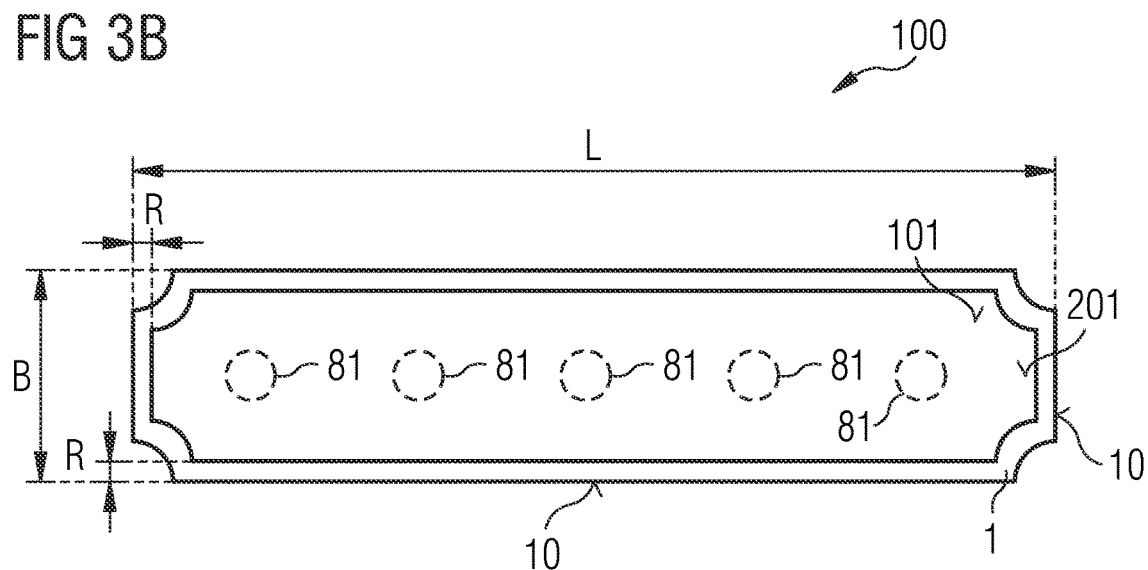

FIG. 3B shows the component 100 in a top view of its radiation exit surface 101. Around the radiation passage surface 201 or the radiation exit surface 101, the component 100 can have a margin R having a lateral width of for instance 5 μm to 30 μm. The margin R can be formed by a material of the shaped body 5 and can cover the semiconductor body 2 in places or completely in lateral directions (not illustrated in FIG. 3A, cf. for instance FIG. 3E). The component 100, in particular the carrier 1, can have inwardly or outwardly curved corners on which the sub-regions 41 or 42 of the metal layer 4 are electrically connectable. A sub-region 41 or 42 arranged on a corner or edge of the carrier 1 can extend over two adjacent side faces 10 in the lateral direction. At least one side face 10 of the carrier 1 or of the component 100 can be formed as a mounting surface of the component, wherein both a first sub-region 41 and a second sub-region 42 of the metal layer 4 can be electrically connectable on this side face 10. In FIG. 3B, the converter layer 7 is not illustrated. If a converter layer 7 is formed on the radiation exit surface 101 or on the radiation passage surface 201, the margin R can be covered in places or completely by the converter layer 7.

The component 100 is formed in particular as a side-looker. A total installation height of the component 100 is therefore given not by the vertical height H of the component 100 but by a lateral width B. Unlike the vertical height H, the lateral width B can be selected almost at will since the width B is established only during singulation. The total installation height B can be 0.1 mm to 0.5 mm, for instance 0.15 mm or 2 mm to 0.5 mm or 0.1 mm to 0.3 mm. The component 100 has a length L which extends along a lateral direction and can be 0.1 mm to 1.5 mm, for instance 0.5 mm to 1.5 mm. Compared to FIG. 3A, the component in FIG. 3B is tilted for instance by 90 degrees. The vertical height H is not illustrated in FIG. 3B. The vertical height H can be 0.3 mm to 1.5 mm or greater.

Figure 3C:
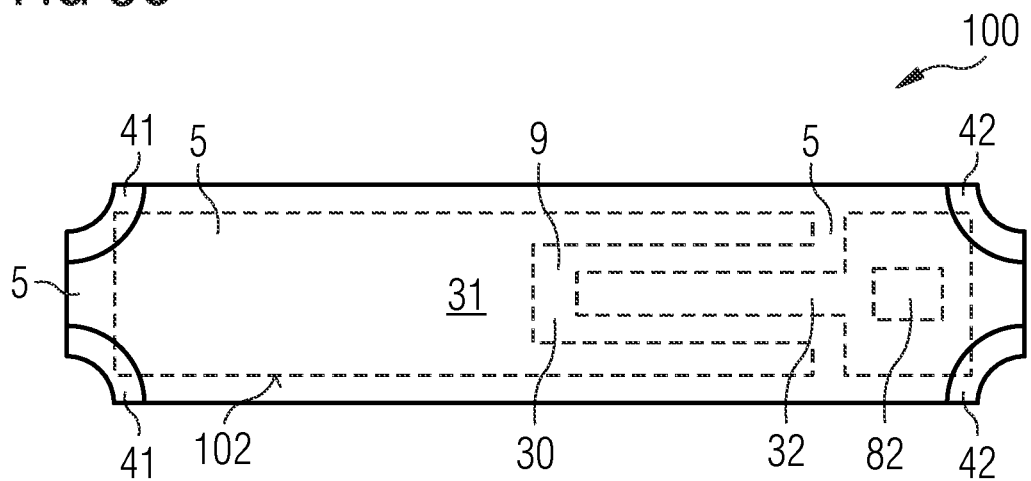

FIG. 3C shows the rear side 102 of the component 100 produced for instance in FIGS. 3A and 3B. The rear side 102 can comprise surfaces of the sub-regions 41 and 42 of the metal layer 4. The component 100 can therefore be electrically contacted both on the side face 10 and on the rear side 102. The component 100 comprises two first sub-regions 41 with a first electrical polarity and two second sub-regions 42 with a second electrical polarity of the component 100. The sub-regions 41 and 42 are arranged in particular at the corners of the component 100. In the vertical direction, the sub-regions 41 and 42 can each cover a vertical edge of the component 100. Such a configuration of the rear side 102 can be achieved for instance by an arrangement of the contact layers 40 according to FIGS. 2E and 2F.

Figure 3D:
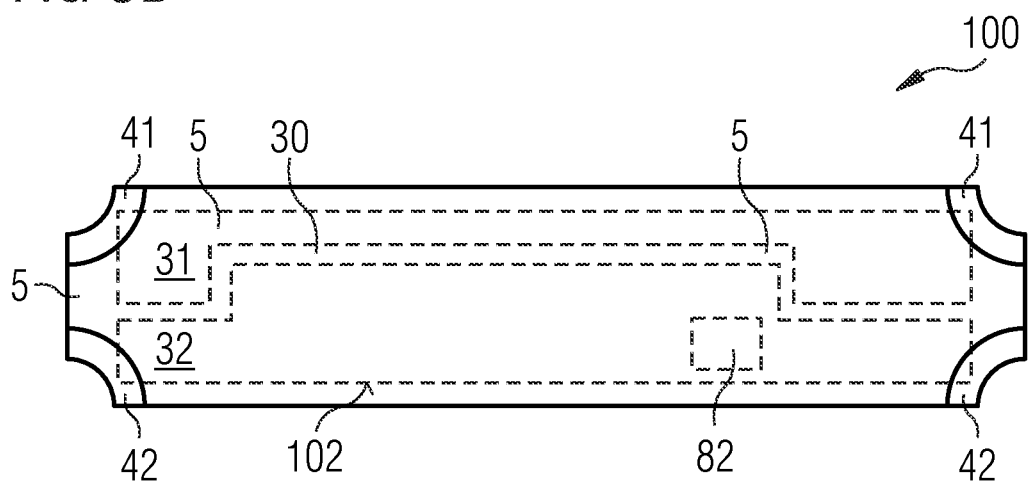

In FIG. 3C, a stabilizing layer 3 having the sublayers 31 and 32 in the shaped body 5 is illustrated, wherein the configuration of the stabilizing layer 3 described in FIG. 3C substantially corresponds to the configuration illustrated in FIG. 1B. The component 100 comprises a connection layer 82 formed in particular as part of the wiring structure 8. By way of the connection layer 82, the second sublayer 32 can electrically connect to the second semiconductor layer 22 of the semiconductor body 2. FIG. 3D shows a further configuration of the stabilizing layer 3, in which—differing from FIG. 3C—the intermediate space 30 extends not along the total width B or the total installation height B but along the total lateral length L.

In FIG. 3E, a further example of a component 100 is illustrated schematically. This example substantially corresponds to the example illustrated in FIG. 3A. In contrast thereto, the rear side 102 of the component or the rear side 12 of the carrier 1 is free from surfaces of the sub-regions 41 and 42 of the metal layer 4. In other words, the sub-regions 41 and 42 extend not over the total vertical height of the carrier 1, but only in places from the front side 11 of the carrier 1 in the direction of the rear side 12 of the carrier 1. The sub-regions 41 and/or 42 here can each extend over at least 20%, at least 30% or at least 50% or at least 70% of the vertical height of the carrier 1.

Furthermore, the radiation passage surface 201 illustrated in FIG. 3E is patterned. The wiring structure 8 can comprise an electrically conductive layer 80, one or a plurality of through-vias 81 and a connection layer 82. The electrically conductive layer 80 is arranged in particular between the semiconductor body 2 and the stabilizing layer 3 or the carrier 1. In particular, the electrically conductive layer 80 comprises a metal and is formed in particular as a radiation-reflecting layer. In particular, the electrically conductive layer 80 adjoins the semiconductor body 2. Alternatively, or in addition to the electrically conductive layer 80, the stabilizing layer 3 can be in a radiation-reflecting form. The insulation structure 9 can extend into the semiconductor body 2 in places and is configured in particular for electrical separation between the sublayers 31 and 32 of the stabilizing layer 3 and for electrical separation between the through-via 81 and the second semiconductor layer 22 and the active layer 23.

In FIG. 3E, the semiconductor body 2 is covered in lateral directions for instance by the plastic forming the shaped body 5. The semiconductor body 2 here can be covered entirely in the lateral directions by this part of the shaped body 5. In a top view, this part of the shaped body can form a margin R, in particular a circumferential margin R, around the semiconductor body (FIG. 3B). The side faces of the semiconductor body 2 can be partly or completely covered by this part of the shaped body 5. It is possible that further layers are arranged between the side faces of the semiconductor body 2 and the shaped body 5 in the lateral direction. It is possible that the shaped body 5 here is formed contiguously. Deviating from FIG. 3E, the insulation layer 9 can cover the side faces of the semiconductor body 2 at least in places.

Figure 4B:
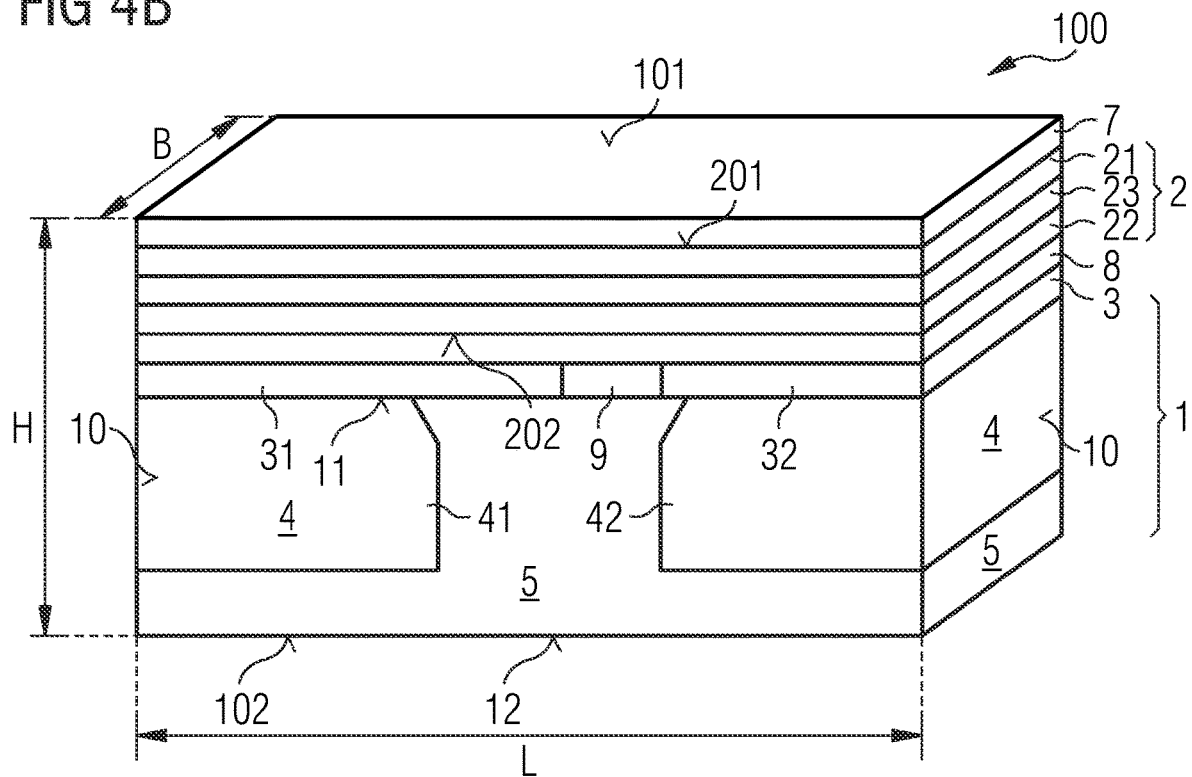
Figure 4C:
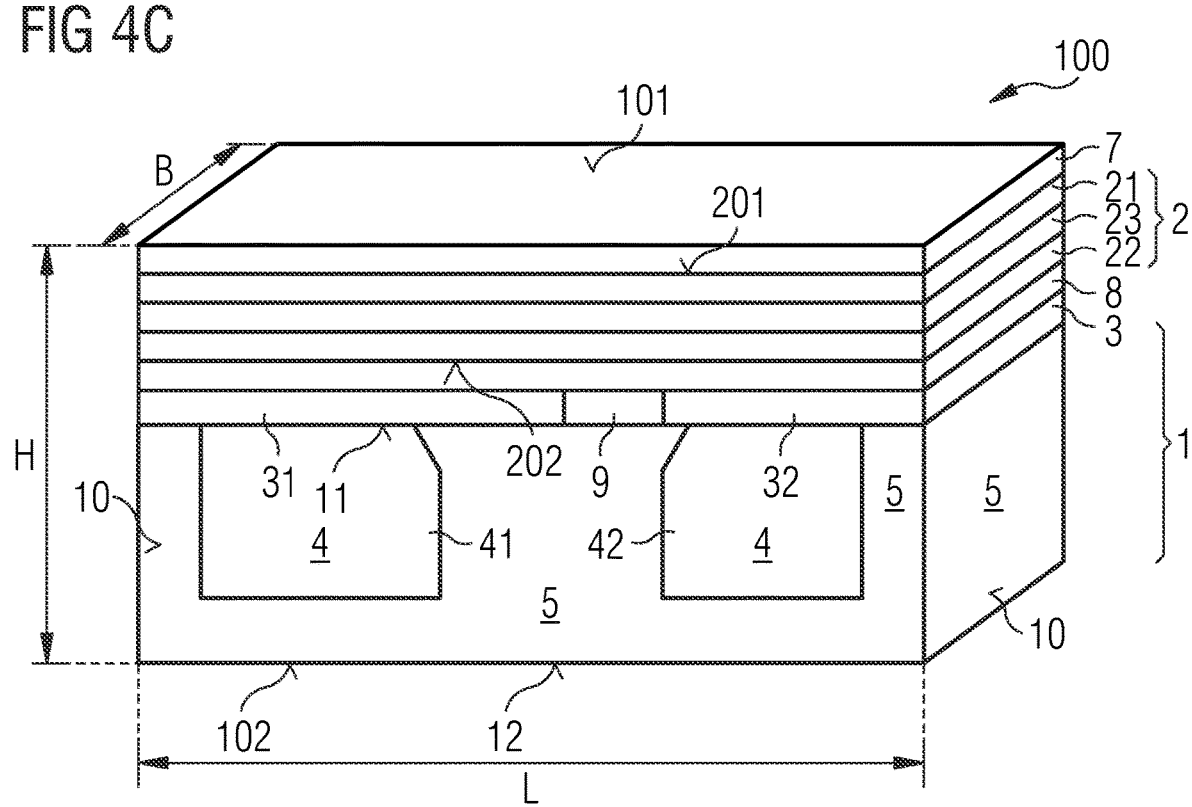

FIGS. 4A to 4C show various examples of a component in schematic 3D views. To illustrate them better, a possible margin R surrounding the semiconductor body 2 is not illustrated. Deviating from FIGS. 4A to 4C, the semiconductor body 2, the stabilizing layer 3 and the contact structure 8 can be covered in lateral directions by an electrically insulating material, for instance by the plastic forming the shaped body 5, in lateral directions.

The example illustrated in FIG. 4A substantially corresponds to the example illustrated in FIG. 3A. In FIG. 3A, the sub-regions 41 and 42 are in particular formed predominantly in the immediate vicinity of the corners or edges of the component 100. In FIG. 4A, the sub-regions 41 and 42 are formed over a comparatively large region of the side face 10. In particular, at least 20%, at least 30%, for instance at least 50% or at least 70% of the total area of the side face 10 formed as a mounting surface can be formed by surfaces of the sub-regions 41 and 42. The carrier 1 can comprise a further side face 10 formed for instance exclusively by a surface of the first or second sub-region of the metal layer 4. A component of this type can be produced e.g. by a method according to FIG. 2A. A component 100 of this type has particularly high mechanical stability.

The example of a component 100 illustrated in FIG. 4B substantially corresponds to the example illustrated in FIG. 4A. In contrast thereto, the rear side 12 of the carrier 1 is free from a surface of the first or second sub-region of the metal layer 4. In other words, the first sub-region 41 and the second sub-region 42 do not extend over the entire vertical height of the carrier 1. The rear side 12 of the carrier 1 can be formed exclusively by a surface of the shaped body 5.

The example of a component 100 illustrated in FIG. 4C substantially corresponds to the example illustrated in FIG. 4B. In contrast thereto, the component 100 can comprise at least one or at least two or precisely two or precisely three side faces 10, which are free from surfaces of the sub-regions 41 and 42 of the metal layer 4. The component 100 can also be formed such that the sub-regions 41 and 42 are electrically connectable exclusively on the side face 10 formed as a mounting surface. The component 100 can comprise four, for instance precisely four, side faces 10. It is also possible that the component 100 comprises a single sub-region 41 and a single sub-region 42. The sub-regions 41 and 42 can be completely surrounded in all directions, apart from the mounting surface 10 and the front side 11 of the carrier 1, by an electrically insulating material, for instance the plastic of the shaped body 5 so that the sub-regions 41 and 42 are protected from environmental influences and so that, furthermore, a possible risk in terms of an electrical short-circuit of the component 100 is largely avoided.

By processing in a wafer composite, it is inter alia unnecessary to produce carriers for components separately and to deposit and electrically connect the semiconductor bodies 2 on these separately produced carriers. It is possible to omit those assembly steps relating to single chip processes such as for instance pick and place representing a considerable portion of the total producing costs of components and, therefore, the components can be produced inexpensively. If the component is configured as a sidelooker, the vertical height H of the component does not contribute to the total installation height B of the component and so the vertical height H can be adjusted to be comparatively thick, as a result of which the component is configured to be particularly mechanically stable and robust during its production and after finishing. The shaped body composite 50 or the shaped body 5 can also be formed sufficiently thickly for the composite 200 to be particularly stable and, therefore, the substrate 70 can for instance be more easily separated from the composite 200. In addition, the total installation height B of the component can even be adjusted during singulation of the composite 200, allowing a particularly low total installation height B to be achieved, as a result of which the component 100 is configured particularly thinly. A component 100 of this type additionally has a radiation-emitting surface, the width of which corresponds for instance to the total installation height B.

This application claims priority of DE 10 2015 111 492.5, the subject matter of which is incorporated herein by reference.

The description of our components and methods with the aid of the examples does not limit this disclosure thereto. Rather, this disclosure comprises any novel feature and any combination of features, which in particular includes any combination of features in the appended claims, even if the feature or combination is not itself explicitly stated in the claims or examples.

The invention claimed is:
1. A component comprises a carrier and a semiconductor body arranged on the carrier, wherein
the carrier comprises a metal layer and a shaped body composed of a plastic, wherein the carrier has a front side facing towards the semiconductor body and a rear side facing away from the semiconductor body, each of which is formed at least in places by a surface of the shaped body, the metal layer contains a first sub-region and a second sub-region, wherein the first sub-region and the second sub-region adjoin the shaped body in a lateral direction, are electrically connectable in a vertical direction on the front side of the carrier, are assigned to different electrical polarities of the component and are thus configured to electrically contact the semiconductor body, the carrier has a side face running perpendicularly or obliquely to the rear side of the carrier and is configured as a mounting surface of the component, wherein at least one of the sub-regions is electrically connectable via the side face and exhibits singulation traces, and the component comprises a stabilizing layer located between the carrier and the semiconductor body to mechanically stabilize the component, wherein the stabilizing layer comprises a first sublayer and a second sublayer electrically separated from the first sublayer, at least one of the sublayers has a comb shape, toothed structure, and another of the sublayers extends into the comb shape, toothed structure in the lateral direction so that the component is mechanically reinforced along all lateral directions.

2. The component according to claim 1, wherein the plastic forming the shaped body is a castable polymer or a circuit board material.

3. The component according to claim 1, wherein the shaped body is mechanically reinforced with glass fibers and/or with glass beads.

4. The component according to claim 1, wherein the first sub-region and the second sub-region differ from one another in terms of their geometry or their spatial dimensions to mark their respective electrical polarity.

5. The component according to claim 1, wherein at least one of the sub-regions electrically conductively connects to the stabilizing layer.

6. The component according to claim 1, wherein the stabilizing layer has a vertical thickness greater than or equal to 10 µm.

7. The component according to claim 1, wherein at least one of the sub-regions is formed to be electrically connectable via both the side face and the rear side of the carrier.

8. The component according to claim 1, further comprising a converter layer on a surface of the semiconductor body facing away from the front side of the carrier, wherein the converter layer contains a converter material capable of converting electromagnetic radiation of a first peak wavelength to electromagnetic radiation of a second peak wavelength.

9. The component according to claim 1, having a total installation height oriented transversely or perpendicularly to the side face formed as a mounting surface and is 0.1 mm to 0.5 mm.

10. The component according to claim 1, wherein the semiconductor body comprises a radiation passage surface facing away from the carrier and is framed in lateral directions at least in places by the plastic forming the shaped body, and in a top view of the carrier, the plastic forms a margin having a lateral width of 5 µm to 30 µm around the radiation passage surface.

11. The component according to claim 1, wherein the first sub-region and the second sub-region are formed to be electrically connectable on opposite edges of the carrier and the sub-regions each extend over at least 30% of the vertical heights of the edges.

12. A method of producing a plurality of components comprising:

A) preparing a composite having a semiconductor layer stack and a contiguous shaped body composite composed of a plastic arranged on the semiconductor layer stack, wherein the semiconductor layer stack is severable into a plurality of semiconductor bodies, B) forming a plurality of contact layers on the semiconductor layer stack to electrically contact the semiconductor bodies, wherein the contact layers each overlap with at least two adjacently arranged semiconductor bodies in a top view, and C) singulating the composite into a plurality of components such that the contact layers are cut during singulation in areas between the adjacently arranged semiconductor bodies, the singulated components each comprise a semiconductor body and a carrier, the semiconductor bodies originating from the semiconductor layer stack, the carrier of the respective component comprises a shaped body and a metal layer, wherein the shaped body originates from the shaped body composite, the metal layer comprises two sub-regions composed of different contact layers to electrically contact the associated semiconductor body and at least one of the sub-regions is formed to be electrically connectable on a side face of the carrier, and each of the components comprises a stabilizing layer located between the carrier and the semiconductor both to mechanically stabilize the component, wherein the stabilizing layer comprises a first sublayer and a second sublayer electrically separated from the first sublayer, at least one of the sublayers has a comb shape, toothed structure, and another of the sublayers extends into the comb shape, toothed structure in the lateral direction so that the component is mechanically reinforced along all lateral directions.

13. The method according to claim 12, wherein for the mechanical stabilizing of the components to be produced, a plurality of stabilizing layers are deposited on the semiconductor layer stack by an electroplating method before formation of the shaped body composite and the contact layers.

14. The method according to claim 13, wherein the plastic is molded or pressed onto the semiconductor layer stack to form the shaped body composite, and contact openings are formed in the shaped body composite for the partial exposure of the stabilizing layers.

15. The method according to claim 12, wherein contact openings are formed in the shaped body composite, the contact openings are not filled, but coated with an electrically conductive material forming the contact layers, and bottom surfaces and internal walls of the contact openings are coated with the electrically conductive material such that each of the resulting contact layers reproduces a contour of the contact opening.

16. The method according to claim 13, wherein the carrier is produced directly on the semiconductor body such that the carrier is not produced in a separate production step from the semiconductor body, but is already applied on the semiconductor body during production thereof.

17. The component according to claim 1, comprising two first sub-regions with a first electrical polarity and two second sub-regions with a second electrical polarity of the component, wherein the first and second sub-regions are arranged at corners of the component, wherein, in the vertical direction, each of the first and second sub-regions covers a vertical edge of the component.

18. The component according to claim 1, formed as a sidelooker, wherein a main emission direction of the component runs parallel to the side face of the carrier formed as a mounting surface of the component.

19. The component according to claim 1, wherein the carrier is produced directly on the semiconductor body and is not attached to the semiconductor body by a connecting layer.

20. A component comprising a carrier and a semiconductor body arranged on the carrier, wherein the carrier comprises a metal layer and a shaped body composed of a plastic, wherein the carrier has a front side facing towards the semiconductor body and a rear side facing away from the semiconductor body, each of which is formed at least in places by a surface of the shaped body, the metal layer contains a first sub-region and a second sub-region, wherein the first sub-region and the second sub-region adjoin the shaped body in a lateral direction, are electrically connectable in a vertical direction on the front side of the carrier, are assigned to different electrical polarities of the component and are thus configured to electrically contact the semiconductor body, the carrier has a side face running perpendicularly or obliquely to the rear side of the carrier and is configured as a mounting surface of the component, wherein at least one of the sub-regions is electrically connectable via the side face, the component is formed as a sidelooker, wherein a main emission direction of the component runs parallel to the side face of the carrier formed as a mounting surface of the component, and the component comprises a stabilizing layer located between the carrier and the semiconductor body to mechanically stabilize the component, wherein the stabilizing layer comprises a first sublayer and a second sublayer electrically separated from the first sublayer, at least one of the sublayers has a comb shape, toothed structure, and another of the sublayers extends into the comb shape, toothed structure in the lateral direction so that the component is mechanically reinforced along all lateral directions.

* * * * *